(12) United States Patent
Jaini et al.

(10) Patent No.: US 11,796,591 B1
(45) Date of Patent: Oct. 24, 2023

(54) SMART STORAGE OF SHUTDOWN LBIST STATUS

(71) Applicant: Ambarella International LP, Santa Clara, CA (US)

(72) Inventors: Praveen Jaini, Sunnyvale, CA (US); Hsin-Wu Hsu, Santa Clara, CA (US); Hejia Yan, Sunnyvale, CA (US)

(73) Assignee: Ambarella International LP, Santa Clara, CA (US)

( * ) Notice: Subject to any disclaimer, the term of this patent is extended or adjusted under 35 U.S.C. 154(b) by 22 days.

(21) Appl. No.: 17/712,651

(22) Filed: Apr. 4, 2022

(51) Int. Cl.
*G01R 31/317* (2006.01)
*G01R 31/3185* (2006.01)

(52) U.S. Cl.
CPC ..... *G01R 31/31724* (2013.01); *G01R 31/317* (2013.01); *G01R 31/31701* (2013.01); *G01R 31/31721* (2013.01); *G01R 31/318555* (2013.01)

(58) Field of Classification Search
CPC ........ G01R 31/31724; G01R 31/31701; G01R 31/31721; G01R 31/318555; G01R 31/317
USPC ..... 714/733, 724, 735, 736, 742, 22, 25, 30, 714/36, 48
See application file for complete search history.

(56) References Cited

U.S. PATENT DOCUMENTS

| | | | |
|---|---|---|---|
| 2017/0074939 A1* | 3/2017 | Anzou | G01R 31/318547 |
| 2017/0098102 A1* | 4/2017 | Coker | G06F 21/76 |
| 2017/0239468 A1* | 8/2017 | Lemke | A61K 31/4468 |
| 2020/0124662 A1* | 4/2020 | Jin | G01R 31/31907 |
| 2020/0278395 A1* | 9/2020 | Herd | G01R 31/31724 |
| 2022/0108760 A1* | 4/2022 | Sinha | G11C 29/14 |

* cited by examiner

*Primary Examiner* — John J Tabone, Jr.
(74) *Attorney, Agent, or Firm* — Christopher P. Maiorana, PC

(57) ABSTRACT

An apparatus comprising a battery and a circuit. The battery may be configured to provide a persistent power source. The circuit may comprise a processor, self-test logic, internal storage and logic circuitry. The self-test logic may be configured to perform a status check to determine an operating status of the logic circuitry. The processor may be configured to enable a first portion of the status check to be performed during a shutdown of the apparatus and a second portion of the status check to be performed during a bootup of the apparatus. The battery may provide the persistent power source to the internal storage after the shutdown of the apparatus. Parameters generated during the first portion may be stored in the internal storage. The parameters stored in the internal storage may be used with the second portion to determine the operating status of the logic circuitry.

19 Claims, 8 Drawing Sheets

US 11,796,591 B1

SMART STORAGE OF SHUTDOWN LBIST STATUS

FIELD OF THE INVENTION

The invention relates to self-test circuitry generally and, more particularly, to a method and/or apparatus for implementing smart storage of shutdown LBIST status.

BACKGROUND

Circuits used in various applications use fault detection when powered on. In one example, LogicBIST is one self-test method used to detect faults in safety mechanisms and achieve latent fault coverage. LogicBIST is designed to run once during each power-on cycle of a chip or circuit. Generally, LogicBIST is executed during a boot process whenever a chip is powered-on. Large circuits, such as large system-on-chips (SoC) can implement multiple LogicBIST controllers. All of the LogicBIST controllers perform the self-test at boot time.

LogicBIST, particularly running multiple LogicBIST tests at the same time, can result in a long boot time. Some applications are sensitive and cannot tolerate the extra startup time. If LogicBIST fails at startup, the chip can go into a safe state and the system can take appropriate action, such as indicating safety violations to an end-user.

The time taken to perform LogicBIST can be reduced by perform LogicBIST at system shutdown. However, since power is no longer available after shutdown, if LogicBIST fails at shutdown then the information detected during LogicBIST is lost. Conventional solutions for LogicBIST at shutdown store the status of shutdown LogicBIST in an external storage device such as external NAND flash or an SD card. However, the process of storing shutdown status on external devices is complicated and adds extra cost.

It would be desirable to implement smart storage of shutdown LBIST status.

SUMMARY

The invention concerns an apparatus comprising a battery and a circuit. The battery may be configured to provide a persistent power source. The circuit may comprise a processor, self-test logic, internal storage and logic circuitry. The self-test logic may be configured to perform a status check to determine an operating status of the logic circuitry. The processor may be configured to enable a first portion of the status check to be performed during a shutdown of the apparatus and a second portion of the status check to be performed during a bootup of the apparatus. The battery may provide the persistent power source to the internal storage after the shutdown of the apparatus. Parameters generated during the first portion of the status check may be stored in the internal storage. The parameters stored in the internal storage may be used with the second portion of the status check to determine the operating status of the logic circuitry.

BRIEF DESCRIPTION OF THE FIGURES

Embodiments of the invention will be apparent from the following detailed description and the appended claims and drawings.

DETAILED DESCRIPTION OF THE EMBODIMENTS

Figure 1:
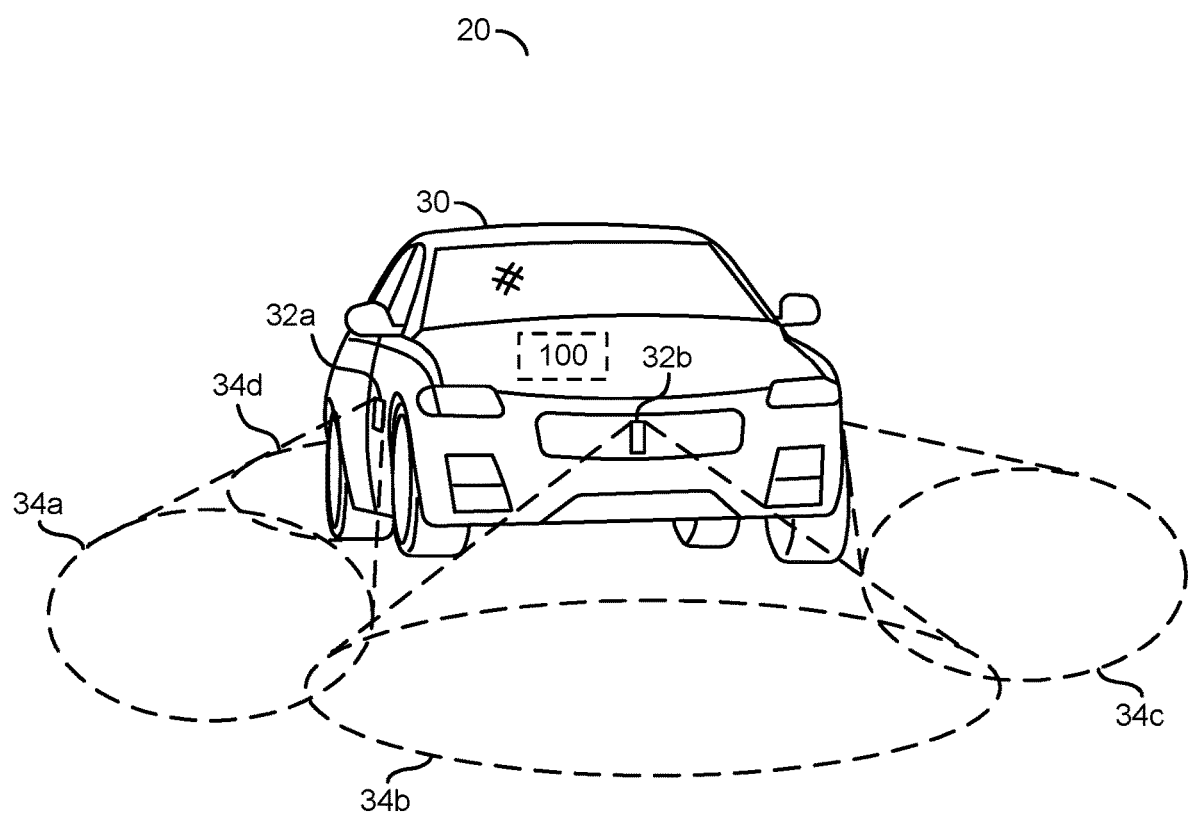
FIG. 1 is a diagram illustrating an example embodiment of the present invention.

Embodiments of the present invention include providing smart storage of shutdown LBIST status that may (i) check an operating status of a circuit, (ii) split checking an operating status between a startup time and a shutdown time, (iii) reduce a bootup time of a circuit, (iv) provide a persistent power source to an internal storage device, (v) store status information about a circuit after a device shutdown, (vi) comply with an automotive standard by preventing a single bit failure, (vii) store self-check information for multiple LBIST controllers, (viii) avoid the complexity of implementing external storage, (ix) indicate whether a self-test was performed on shutdown and if the self-test passed, (x) store a first-time power on status and/or (xi) be implemented as one or more integrated circuits.

Embodiments of the present invention may be configured to implement smart storage for a status check during a device shutdown. The smart storage may be configured to implement an internal storage that may be powered by a persistent power source. The persistent power source may enable the internal storage to be powered to provide storage while the device is powered off. The information stored in the internal storage may be available during a bootup sequence of the device.

Embodiments of the present invention may be configured to enable the status check to be performed partially during shutdown of the device and partially during bootup of the device. By splitting the status check between shutdown and bootup, an amount of time to bootup the device may be reduced compared to when the status check is performed entirely during bootup of the device. For example, an overall bootup time of the device may be reduced by the amount of time equivalent to a shutdown check amount of time (e.g., the amount of time used to perform a status check during shutdown). In an example, the status check performed may be a LogicBIST (LBIST) technique. A portion of the LBIST may be performed during shutdown and the results of the LBIST may be stored in the internal storage. The results stored in the internal storage may be retrieved during bootup to complete a bootup portion of the LBIST. In some embodiments, other types of safety checks may be split between startup and shutdown to enable safety checks performed at shutdown to reduce a bootup time of the device.

The internal storage implemented may be configured to provide persistent storage of the status information of the LBIST. The persistent storage may be provided in a number of registers on a chip. The internal storage may be implemented with an individual power supply. In an example, the internal storage may be provided by a battery that is separate from the power supply used by the device. Implementing the persistent power source may enable the registers to hold a storage state even when the rest of the device is powered off. Storing the status information in the registers even after the device is powered off may provide storage of the LBIST status internal to the device and may avoid additional complexity and/or cost of interfacing with external storage devices (e.g., flash memory, SD cards, etc.).

When the device is powered on, a processor may read the status of the shutdown LBIST from the persistent storage registers. The persistent storage registers may indicate whether the shutdown LBIST was executed and whether the shutdown LBIST passed. In an example, for each LBIST controller that runs at shutdown, two bits of information may be stored in the internal storage. Generally, the processor may divide the LBIST controllers into LBIST controllers that may perform the status check at startup and LBIST controllers that may perform the status check at shutdown. The LBIST controllers that perform the status check at shutdown may fully execute LBIST operations and store the status check information in the internal storage. When the device is powered on, the processor may check the status check information stored in the internal storage and enable the LBIST controllers that perform the status check at startup to fully execute the LBIST operations to determine if there are any hardware defects.

In order to prevent the stored data from being misinterpreted, a second version of the status information may be stored. The second version may store the inverse value of the status information. In an example, storing a second version of the status information may prevent a random hardware defect from affecting the persistent storage. Generally, automotive design guidelines and/or standards (e.g., ISO26262 standard) may require protection from random hardware defects. Storing two versions of the status information may ensure compliance with automotive guidelines and/or standards. For example, if the status information and the duplicate of the status information provides the same value, then there may be a hardware defect (e.g., the data stored may not be reliable and the LBIST may be performed entirely during the bootup sequence).

Embodiments of the present invention may be configured to prevent data in the internal storage from being misinterpreted as a hardware defect during a first time power on. For example, after a first time power on (e.g., there is no prior status information from a previous shutdown to store in the internal storage), the status information and the duplicate value may be the same value. The internal storage may be further configured to provide power status bits (e.g., life identity bits). The life identity bits may provide an indication of a first time power on event, which may enable checking the status of the internal storage to be skipped (e.g., the full LBIST may be performed during startup).

Embodiments of the present invention may be configured to integrate with the hardware and/or software based testing implemented by LBIST and/or other self-testing mechanisms. The LBIST and/or other self-testing mechanisms may be implemented to check for defects in logic gates when the device is powered on. The processor may be implemented to enable a portion of the LBIST to be performed at shutdown. The processor may implement a handshake technique to enable the status information stored in the internal storage to be passed to the startup portion of the LBIST.

Referring to FIG. 1, a diagram illustrating an example embodiment of the present invention is shown. An external view 20 of a vehicle 30 is shown. A capture device 32a is shown on a passenger side of the vehicle 30. A capture device 32b is shown on a front grille of the vehicle 30. Similarly, other capture devices (e.g., 32c-32n) may be implemented on various locations of the exterior of the vehicle 30 (not visible from the perspective of the external view 20 shown). In an example, one of the capture devices 32a-32n may be implemented on a driver side of the vehicle 30. In yet another example, one of the capture devices 32a-32n may be implemented on a rear end of the vehicle 30 (e.g., near a rear bumper). In still another example, one of the capture devices 32a-32n may be implemented on a roof of the vehicle 30 (e.g., directed towards the rear). In another example, one or more of the capture devices 32a-32n may be implemented within the vehicle 30 (e.g., to monitor passengers in the interior cabin). The number, type and/or locations of the capture devices 32a-32n may be varied according to the design criteria of a particular implementation.

An all-around view 34a-34d is shown. In an example, the all-around view 34a-34d may enable an automatic vehicle monitoring (AVM) system. The AVM system shown may comprise four cameras (e.g., each camera may comprise a combination of one of the capture devices 32a-32n (or a stereo pair of the capture devices 32a-32n)). Other AVM system implementations may comprise other arrangements and/or amounts of the capture devices 32a-32n. In the perspective shown in the external view 20, the capture device 32a and the capture device 32b may each be one of the four cameras and the other two cameras may not be visible.

A block (or circuit) 100 is shown. The block 100 may implement an apparatus configured to implement an embodiment of the present invention. In one example, the apparatus 100 may implement a circuit comprising various sub-components and/or modules (to be described in association with FIG. 2). The apparatus 100 may be configured to implement smart storage of self-test and/or LBIST shutdown status. In the example shown, the apparatus 100 may be implemented in an automotive context. For example, the apparatus 100 may be a component implemented within the vehicle 30. While one instance of the apparatus 100 is shown in the vehicle 30, the vehicle 30 may implement multiple components comprising the apparatus 100.

The apparatus 100 may be configured to implement various functionality for the automotive market. In an example, the apparatus 100 may be configured to comply with an ISO26262 Safety Standard (e.g., a requirement for detection of random hardware defects that could occur during the operation of the apparatus 100). For example, the apparatus 100 may be configured to perform various driver assistance features (e.g., lane detection, proximity detection, pedestrian detection, object detection, etc.). The functionality implemented by the apparatus 100 may be varied according to the design criteria of a particular implementation.

In the example external view 20 shown, the apparatus 100 may be configured to provide functionality for the AVM. For example, the apparatus 100 may be configured to receive input (e.g., pixel data) from each of the capture devices 32a-32n. In an example, each camera providing the all-around view 34a-34d may implement a fisheye lens (e.g., the capture device 32a and the capture device 32b shown may implement fisheye lenses) and may capture a video frame with a 180 degrees angular aperture. The all-around view 34a-34d is shown providing a field of view coverage all around the vehicle 30. For example, the portion of the all-around view 34d may provide coverage for a rear of the vehicle 30, the portion of the all-around view 34a may provide coverage for a passenger side of the vehicle 30, the portion of the all-around view 34b may provide coverage for a front of the vehicle 30 and the portion of the all-around view 34c may provide coverage for a driver side of the vehicle 30. Each portion of the all-around view 34a-34d may be one field of view of a camera mounted to the vehicle 30. Each portion of the all-around view 34a-34d may be dewarped and stitched together by the apparatus 100 to provide an enhanced video frame that represents a top-down view near the vehicle 30. The apparatus 100 may modify the top-down view based on the all-around view 34a-34d to provide a representation of a bird's-eye view of the vehicle 30.

The all-around view 34a-34d may be captured by four of the capture devices (e.g., 32a-32d) that provide input to the apparatus 100. In some embodiments, the capture devices 32a-32d may be connected to an on-board processing system (e.g., a PC, a FPGA, a DSP, an ASIC, etc.). For example, the capture devices 32a-32d may be connected to the apparatus 100. A video processing pipeline of the apparatus 100 may receive the captured video frames (e.g., images) and process the video frames to create a bird's-eye view. The apparatus 100 may be further configured to detect image features for object detection using the computer vision operations.

In some embodiments, the all-around view 34a-34d may be presented to a driver on one or more of the displays implemented in the vehicle 30 in real-time. The all-around view 34a-34d may assist the driver by providing a representation of the position of the vehicle 30 with respect to nearby obstacles that may be difficult to see because of the body of the vehicle 30 may obstruct the view of the driver. When the driver of the vehicle 30 is performing a maneuver near an obstacle, the all-around view 34a-34d may be one useful perspective.

In some embodiments, the all-around view 34a-34d may be used by the apparatus 100 to detect objects and/or determine a location of objects with respect to the vehicle 30 using computer vision operations. The results of the computer vision operations may enable the apparatus 100 to understand the surroundings of the vehicle 30. The results of the computer vision operations may be used to enable autonomous driving of the vehicle 30. In one example, the apparatus 100 may be configured to provide controls to various systems of the vehicle 30 (e.g., a drive train, a steering system, a braking system, etc.). In another example, the apparatus 100 may be configured to provide the results of the computer vision operations to a system of the vehicle 30 that provides autonomous controls to the vehicle 30. The implementation of the autonomous control of the vehicle 30 may be varied according to the design criteria of a particular implementation.

The results of the computer vision operations performed using the video frames generated in response to the all-around view 34a-34d may be used to provide data for autonomous control of the vehicle 30. The autonomous control of the vehicle 30 may be configured to perform a vehicle maneuver. In one example, the vehicle maneuver may comprise backing into and/or pulling out of a parking spot. In another example, the vehicle maneuver may comprise performing parallel parking. In yet another example, the vehicle maneuver may comprise changing a lane in traffic. In still another example, the vehicle maneuver may comprise full autonomous control of the vehicle 30. In order to acquire the data about the objects near the vehicle 30, the all-around view 34a-34d may need to provide sufficient detail for object detection.

The various features and/or functionality for the AVM system implemented by the apparatus 100 may be implemented by various circuitry in the apparatus 100. In an example, the apparatus 100 may comprise various sub-systems each comprising logic circuitry to implement the various features (e.g., computer vision, video encoding, video output, generating video frames from the pixel data from each of the capture devices 32a-32d, etc.). The apparatus 100 may be configured to perform self-testing mechanisms on each of the various sub-systems to determine a status of the various sub-systems. The apparatus 100 may be configured to divide the status checking of the various sub-systems into checks that may be performed at startup and checks that may be performed during shutdown. By dividing the status checks between startup and shutdown, an overall bootup time of the device may be reduced compared to performing all of the status checks during startup. The status checks may ensure that the logic circuitry used to perform the various features of the apparatus 100 may be generating reliable information.

While the external view 20 may provide an example context of the apparatus 100 for the vehicle 30, the apparatus 100 may be implemented for various other applications (e.g., various edge devices). In some embodiments, the apparatus 100 may be implemented in smart IP cameras (e.g., camera systems). In some embodiments, the apparatus 100 may be implemented in low power technology designed to be deployed in embedded platforms at the edge of a network where power consumption is a critical concern (e.g., microprocessors running on sensors, cameras, or other battery-powered devices). In an example, the apparatus 100 may be implemented in various traffic cameras and intelligent transportation systems (ITS) solutions. In some embodiments, the apparatus 100 may be implemented in automated number plate recognition (ANPR) cameras, traffic cameras, access control cameras, automatic teller machine (ATM) cameras, bullet-style security cameras, dome security cameras, webcams, action cameras, drone cameras, etc. In an example, the apparatus 100 may be implemented as traffic cameras and intelligent transportation systems (ITS) solutions designed to enhance roadway security with a combination of person and vehicle detection, vehicle make/model recognition, and automatic number plate recognition (ANPR) capabilities. The types of devices that implement the apparatus 100 may be varied according to the design criteria of a particular implementation.

Figure 2:
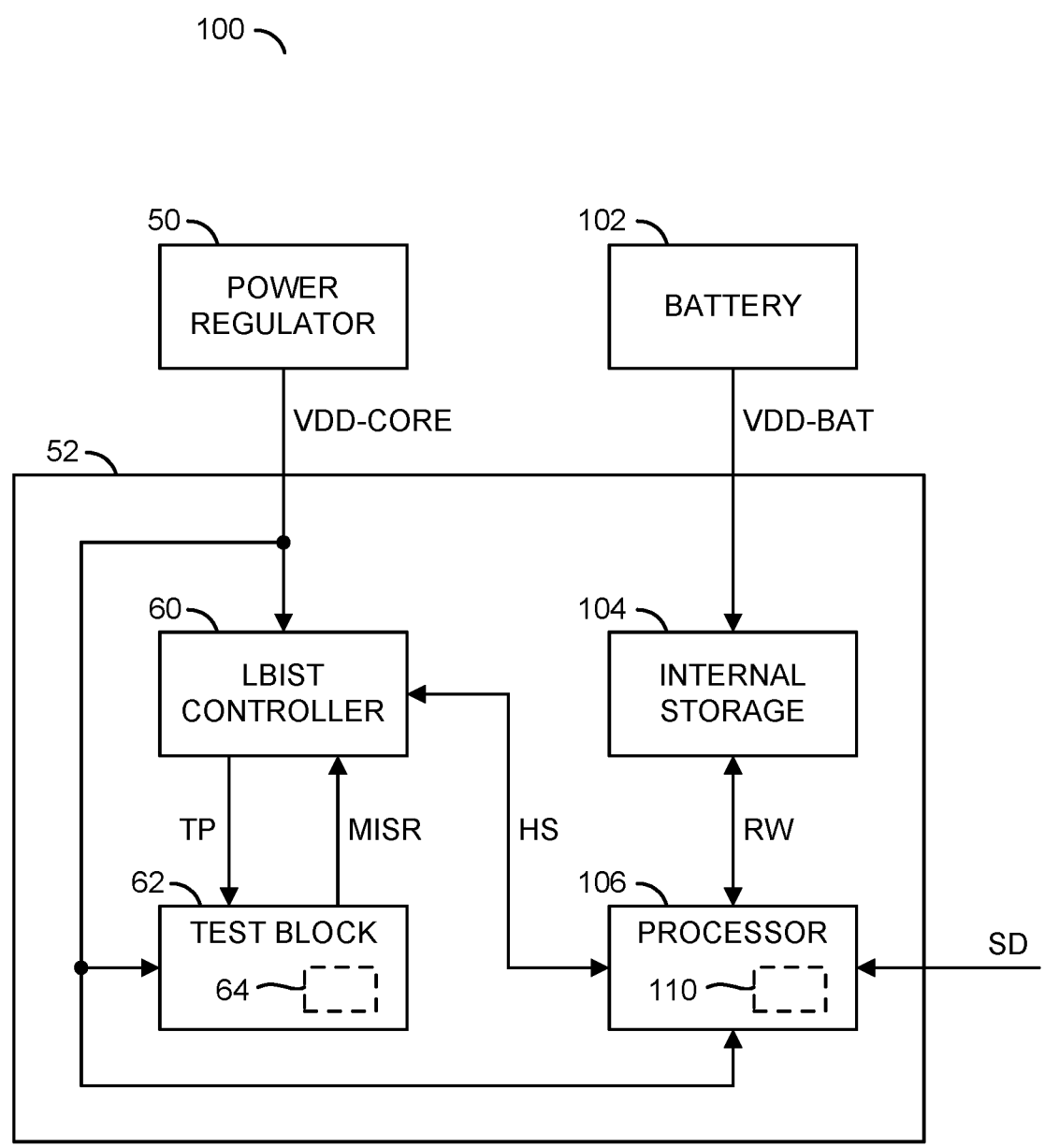
FIG. 2 is a block diagram implementing smart storage for LBIST shutdown.

Referring to FIG. 2, a block diagram implementing smart storage for LBIST shutdown is shown. Components of the apparatus 100 are shown. The apparatus 100 may comprise a block (or circuit) 50, a block (or circuit) 52 and/or a block (or circuit) 102. The circuit 50 may implement a power regulator. The circuit 52 may be configured to implement various functionality of the apparatus 100. The circuit 102 may implement a battery. The circuit 52 may comprise a block (or circuit) 60, a block (or circuit) 62, a block (or circuit) 104 and/or a block (or circuit) 106. The circuit 60 may implement self-test logic. The circuit 62 may implement a test block. The circuit 104 may implement internal storage. The circuit 106 may implement a processor. The apparatus 100 may comprise other components (not shown). The number, type and/or arrangement of the components of the apparatus 100 may be varied according to the design criteria of a particular implementation.

The power regulator 50 may be configured to provide power to the various components of the circuit 52. The power regulator 50 may be configured to convert a voltage provided from an external source to a voltage usable by the components of the circuit 52. In an example, the power regulator 50 may receive power from an external power supply and convert the external power supply to a stable pre-determined voltage level (e.g., 12V, 5V, 3.3V, 2.5V, 1.8V, 1.5V, 1.2V, etc.). The pre-determined voltage level may be varied according to the design criteria of a particular implementation.

The power regulator 50 may generate a signal (e.g., VDD-CORE). The signal VDD-CORE may comprise the stable pre-determined voltage level. The signal VDD-CORE may be presented to the circuit 52. The power regulator 50 may only provide the signal VDD-CORE while the apparatus 100 is powered on. For example, when the apparatus 100 is powered off (e.g., the external power supply is removed), the power regulator 50 may not generate the signal VDD-CORE (e.g., components powered by the power regulator 50 may lose power).

The battery 102 may be configured to provide power to the internal storage 104. The battery 102 may be configured to provide a constant voltage to the internal storage 104. In an example, the battery 102 store power and provide the stored power at a stable pre-determined voltage level (e.g., 12V, 5V, 3.3V, 2.5V, 1.8V, 1.5V, 1.2V, etc.) to the internal storage 104. The pre-determined voltage level may be varied according to the design criteria of a particular implementation.

The battery 102 may generate a signal (e.g., VDD-BAT). The signal VDD-BAT may comprise the stable pre-determined voltage level. The signal VDD-BAT may be presented to the internal storage 104. The battery 102 may continually provide the signal VDD-BAT while the battery has stored power available (e.g., until the power stored by the battery 102 is consumed). The battery 102 may provide the signal VDD-BAT to the internal storage 104 while the apparatus 100 is powered on and after the apparatus is powered off. For example, when the apparatus 100 is powered off (e.g., the external power supply is removed), the internal storage 104 may continue to receive power from the signal VDD-BAT even while other components powered by the signal VDD-CORE have lost power.

The battery 102 may be implemented as a coin-type battery. In one example, the battery 102 may be a CR2032 coin-type battery. In another example, the battery 102 may be a 6.8 mm lithium rechargeable coin-type battery configured to provide 1.5V with 2.5 mAh. In some embodiments, the power regulator 50 may provide the voltage VDD-CORE to provide a power source for recharging the battery 102. In some embodiments, the battery 102 may be rechargeable from an external power supply. The type, shape and/or storage capacity of the battery 102 may be varied according to the design criteria of a particular implementation.

The self-test logic 60 may be configured to perform a status check. The status check performed by the self-test logic 60 may be configured to determine an operating status of a circuit under test (e.g., the test block 62). The status check may comprise a full unit operation for the test block 62. The self-test logic 60 may perform the status check during each drive cycle of the apparatus 100 (e.g., from the time the apparatus 100 is powered on to the time the apparatus 100 is powered down). The status check performed by the self-test logic 60 may comprise a hardware safety mechanism. In the example shown, the self-test logic 60 may implement an LBIST controller. The self-test logic 60 may implement other types of self-testing protocols. The types of operations and/or protocols implemented by the self-test logic 60 may be varied according to the design criteria of a particular implementation.

The LBIST controller 60 may be configured to perform the LogicBIST operations. The LogicBIST operations may comprise a combination of hardware and/or software configured to perform a status check. The status check performed by the LogicBIST operations may be configured to check for defects in logic circuits (e.g., logic gates) of the test block 62. The LBIST controller 60 may generally be configured to perform the LBIST operations when the apparatus 100 is powered on (e.g., after the power regulator 50 initially provides the voltage VDD-CORE). For example, the LBIST operations performed by the LBIST controller may be normally executed as part of a boot sequence of the apparatus 100. The processor 106 may be configured to enable the LBIST controller 60 to split the LBIST operations to partially run at startup and partially run before the apparatus 100 is powered down. The LBIST controller 60 may comprise and/or communicate with a pseudo-random test pattern generator and/or an output response analyzer (not shown).

The LBIST controller 60 may be configured to receive the signal VDD-CORE from the power regulator 50. For example, when the external power source is removed (e.g., on shutdown), the power regulator 50 may stop supplying the signal VDD-CORE and the LBIST controller 60 may lose power and stop operating. The LBIST controller 60 may be configured to send/receive a signal (e.g., HS). The signal HS may comprise a handshake mechanism between the LBIST controller 60 and the processor 106. For example, when the LBIST operations are split between startup and shutdown, the signal HS may communicate data for the handshake mechanism to pass a status of the portion of the LBIST operations performed at shutdown to the processor 106 so that the status information may be stored for use with the portion of the LBIST operations performed at startup to determine the operating status of logic circuitry of the apparatus 100. The LBIST controller 60 may be configured to generate a signal (e.g., TP). The signal TP may comprise a test pattern communicated to the test block 62. In an example, the signal TP may comprise pseudo-random test patterns that may be applied to internal scan chains of the test block 62 for the LBIST operations testing. The LBIST controller 60 may be configured to receive a signal (e.g., MISR). The signal MISR may comprise readings, statistics and/or results generated by the test block 62. For example, the LBIST controller 60 may analyze the data in the signal MISR to determine whether there is a hardware defect in the test block 62.

The test block 62 may be one or more circuits implemented by the apparatus 100. The test block 62 may comprise a block (or circuit) 64. The circuit 64 may implement hardware logic gates. The test block 62 may comprise other components (not shown). The number, type and/or arrangement of the components of the test block 62 may be varied according to the design criteria of a particular implementation.

The test block 62 may be any type of circuit that may be tested using the LBIST operations by the LBIST controller 60. The test block 62 may be a circuit under test (e.g., CUT) by the LBIST controller 60. While a single test block 62 is shown, in some embodiments, the LBIST controller 60 may be configured to perform the LBIST operations for multiple circuits. In an example, the test block 62 tested by the LBIST controller 60 may comprise circuits that may be grouped together for testing with the LBIST controller 60 based on size, clock domain, physical location, etc. The test block 62 may be configured to receive the signal VDD-CORE from the power regulator 50. For example, when the external power source is removed (e.g., on shutdown), the power regulator 50 may stop supplying the signal VDD-CORE and the test block 62 may lose power and stop operating. The test block 62 may be configured to receive the signal TP from the LBIST controller 60. In an example, the LBIST controller 60 may communicate the signal TP to the test block 62 to perform the LBIST operations. The LBIST operations provided by the signal TP may be configured to provide pre-defined test input to the logic gates 64.

The test block 62 may be configured to generate the signal MISR. The logic gates 64 may respond to the pre-defined test input of the signal TP with the output signal MISR. The output of the logic gates 64 in response to the pre-defined test input may be communicated to the LBIST controller 60 as the signal MISR. The LBIST controller 60 may be configured to analyze the output signal MISR of the logic gates 64 generated in response to the signal TP, to determine whether there are any hardware defects. For example, the LBIST controller 60 may expect particular output from the logic gates 64 in response to the pre-defined test input TP. If the logic gates 64 outputs the signal MISR that does not match the expected particular output, then the LBIST controller 60 may detect a hardware defect.

The test block 62 may be an integrated circuit of the apparatus 100. The test block 62 may be an integrated circuit implemented for military, medical and/or automotive applications. Generally, the test block 62 that may be tested using the LBIST controller 60 may be a component of a mission-critical circuit (e.g., where accurate and/or reliable output is considered a requirement). In some embodiments, the test block 62 may be a component of a smartphone and/or other consumer electronics. The test block 62 may comprise a system-on-chip (SoC) and/or a component of a SoC. The types of applications the test block 62 is implemented in and/or the type of integrated circuit implemented by the test block 62 may be varied according to the design criteria of a particular implementation.

The internal storage 104 may comprise one or more registers. The internal storage 104 may be configured to store results of the LBIST operations. The internal storage 104 may be configured to receive the signal VDD-BAT. The internal storage 104 may generally be configured to provide storage when the apparatus 100 is powered on (e.g., after the power regulator 50 initially provides the voltage VDD-CORE to the other components of the apparatus 100) and/or after the apparatus 100 has been powered off (e.g., after the external power supply is removed and the power regulator 50 is no longer provided to other components of the apparatus 100). The signal VDD-BAT may provide a constant power supply for the internal storage 104. Generally, the internal storage 104 may be powered by the battery 102 (e.g., the signal VDD-BAT) without receiving power (e.g., the signal VDD-CORE) from the power regulator 50.

The internal storage 104 may be configured to store results of the LBIST operations that are performed during shutdown of the apparatus 100. The persistent (e.g., battery powered) storage provided by the internal storage 104 may be configured to save the status information (e.g., the results of the shutdown portion of the LBIST operations). The internal storage 104 may be configured to ensure that the status information stored is not corrupted due to random single-bit failure (e.g., as required by ISO26262 standard). Details of the layout of the internal storage 104 may be described in association with FIG. 4.

The internal storage 104 may be an internal component of the circuit 52. The internal storage 104 may comprise powered registers that provide persistent storage using the signal VDD-BAT from the battery 102. Powering the internal storage 104 using the battery 102 may enable the internal storage 104 to be implemented on-board and without implementing an interface to an external storage device (e.g., a microSD interface, an external NAND flash memory interface, a SATA interface, etc.). Implementing an interface to an external storage device may increase complexity and/or cost compared to implementing the internal storage 104.

The internal storage 104 may be configured to send/receive a signal (e.g., RW). The signal RW may comprise read/write information communicated between the internal storage 104 and the processor 106. In one example, the signal RW may comprise the results of the shutdown portion of the LBIST operations communicated by the processor 106 that may be stored in the internal storage 104 while the apparatus 100 is powered down. In another example, the signal RW may comprise the results of the shutdown portion of the LBIST operations communicated by the internal storage 104 to the processor 106 to be used for the startup portion of the LBIST operations while the apparatus 100 is powered on.

The processor 106 may comprise a block (or circuit) 110. The circuit 110 may comprise computer readable instructions and/or firmware. The processor 106 may comprise other components (not shown). The number, type and/or arrangement of the components of the processor 106 may be varied according to the design criteria of a particular implementation.

The processor 106 may be a microprocessor implemented on-board the apparatus 100. The processor 106 may be external to the LBIST controller 60 and internal to the apparatus 100. In one example, the processor 106 may be an ARM processor. In another example, the processor 106 may be an x86 processor. In still another example, the processor 106 may be a RISC-V processor. The type of instruction set implemented by the processor 106 may be varied according to the design criteria of a particular implementation.

The processor 106 may be configured to receive the signal VDD-CORE from the power regulator 50 and/or a signal (e.g., SD). The signal SD may comprise a shutdown signal. In some embodiments, the processor 106 may receive the shutdown signal SD from an external power regulator indicating that the apparatus 100 may be powered down. In some embodiments, the signal SD may be generated internally by the processor 106 when a shutdown instruction is received and/or generated. The implementation of the shutdown process for the processor 106 may be varied according to the design criteria of a particular implementation.

For example, when the external power source is removed (e.g., on shutdown), the power regulator 50 may stop supplying the signal VDD-CORE and the processor 106 may lose power and stop operating. The processor 106 may be configured to send/receive the signal HS. The processor 106 may be configured to implement the handshake mechanism with the LBIST controller 60 that may enable the status information from the shutdown portion of the LBIST operations to be used during bootup along with the startup portion of the LBIST operations.

The computer readable instructions 110 may be a sequence of operations that may be executed by the processor 106. The computer readable instructions 110, when executed by the processor 106 may be configured to implement the handshake mechanism between the processor 106 and the LBIST controller 60. The handshake mechanism implemented by the processor 106 may enable one portion of the status check performed by the LBIST controller 60 to be performed during a shutdown of the apparatus 100 and another portion of the status check to be performed by the LBIST controller 60 during a bootup of the apparatus 100.

The processor 106 may enable the LBIST operations to be split between the shutdown sequence of the apparatus 100 and the bootup sequence of the apparatus 100. The LBIST operations performed by the LBIST controller 60 may implement a self-test mechanism for testing the logic gates 64. The LBIST controller 60 may be configured to perform the self-test without interaction with circuitry outside of the apparatus 100. In some embodiments, the test block 62 may not be fully operational until the LBIST controller 60 determines that the results of the LBIST operations on the test block 62 provide a pass result.

The processor 106 may be configured to present the signal HS to the LBIST controller 60 to initiate the LBIST operations. In an example, the signal HS may provide a LBIST start command. The LBIST controller 60 may perform the LBIST operations on the test block 62 in response to the LBIST start command. The LBIST controller 60 may communicate a pass/fail result for the logic gates 64 and a LBIST done flag the test is fully performed and completed. The pass/fail result and a LBIST done flag may be communicated to the processor 106. The processor 106 may communicate the LBIST done flag and/or the pass/fail result to the internal storage 104.

The computer readable instructions 110 may be configured to select which status check operations may be performed during the shutdown of the apparatus 100 and which status check operations may be performed during the bootup of the apparatus 100. In some embodiments, a single LBIST controller, as shown, may be configured to either perform the LBIST operations at startup or perform the LBIST operations during shutdown. In some embodiments, the self-check logic 60 may be configured to partially perform the status check operations during startup and partially perform the status check during shutdown. The processor 106 may determine which of the status check operations may be performed during shutdown and which of the status check operations may be performed during startup. In embodiments implementing multiple LBIST controllers (to be described in association with FIG. 3), the processor 106 may determine which of the LBIST controllers may perform a full check using the LBIST operations during shutdown and which of the LBIST controllers may perform a full check using the LBIST operations during startup.

In response to the shutdown of the apparatus 100 (e.g., the shutdown signal SD is received), the processor 106 may communicate LBIST start command in the signal HS to the LBIST controller 60. In response to the LBIST start command, the LBIST controller 60 may perform the shutdown portion of the LBIST operations. The LBIST controller 60 may communicate the signal TP to the test block 62 to test the logic gates 64 for defects. The logic gates 64 may generate the signal MISR in response to the test pattern in the signal TP. The LBIST controller 60 may analyze the signal MISR to determine the results of the shutdown portion of the LBIST operations. The LBIST controller 60 may communicate the signal HS comprising the pass/fail result and/or the LBIST done flag for the shutdown portion of the LBIST operations. In an example, where the LBIST controller 60 detects a hardware defect in with the logic gates 64, the signal HS may comprise a defect signal. The processor 106 may perform a response based on the defect signal. In response to the signal HS, the processor 106 may generate the signal RW to store the done flag and/or the pass/fail result (e.g., the status check information) for the shutdown portion of the LBIST operations in the internal memory 104. The internal memory 104 may store the status check information even after the apparatus 100 has been shutdown.

When the apparatus 100 has been started up (e.g., the external power supply has been connected to enable the power regulator 50 to provide the signal VDD-CORE), the processor 106 may retrieve the status check information from the internal memory 104. The processor 106 may receive the signal RW from the internal memory 104 comprising the status information from the shutdown portion of the LBIST operations. The processor 106 may generate the signal HS comprising the LBIST start command. The signal HS may be generated in response to the computer readable instructions 110 providing the start command to initiate the LBIST operations by the LBIST controller 60 to perform during the bootup sequence of the apparatus 100. In response to the LBIST start command, the LBIST controller 60 may perform the LBIST operations for the system bootup. The LBIST controller 60 may communicate the signal TP to the test block 62 to test the logic gates 64 for defects. The logic gates 64 may generate the signal MISR in response to the test pattern in the signal TP. The LBIST controller 60 may analyze the signal MISR to determine the results of the LBIST operations performed during bootup. The LBIST controller 60 may communicate the signal HS comprising the pass/fail result and/or the LBIST done flag for the LBIST operations performed during bootup. If the LBIST controller 60 detects a defect with the logic gates 64, the signal HS provided to the processor 106 may be a defect signal. The processor 106 may determine a response to the defect signal (e.g., enter a safe state, reboot the apparatus 100, log the error, etc.).

Generally, the LBIST controller 60 may perform the LBIST operations either at bootup or at shutdown. In some embodiments, (e.g., the internal memory 104 loses power and/or the stored results are indeterminate), the LBIST controller 60 that already performed the LBIST operation during shutdown may repeat the LBIST operations during startup. Similarly, during a first time bootup of the apparatus 100 (e.g., no prior status information stored in the internal memory 104), the LBIST controller 60 may perform the LBIST operations during bootup, even if the LBIST controller 60 may be selected as one of the LBIST controllers that may perform the LBIST operations during shutdown.

After the processor 106 receives the results of both the shutdown portion of the LBIST operations and the startup portion of the LBIST operations, the processor 106 may determine whether the LBIST operations have been successfully completed. In one example, the processor 106 may respond to any defects detected if the status information from the LBIST operations indicates a hardware defect. In another example, the processor 106 may enable normal operations for the hardware components of the apparatus 100 if the status information from the LBIST operations indicate a pass result.

Figure 3:
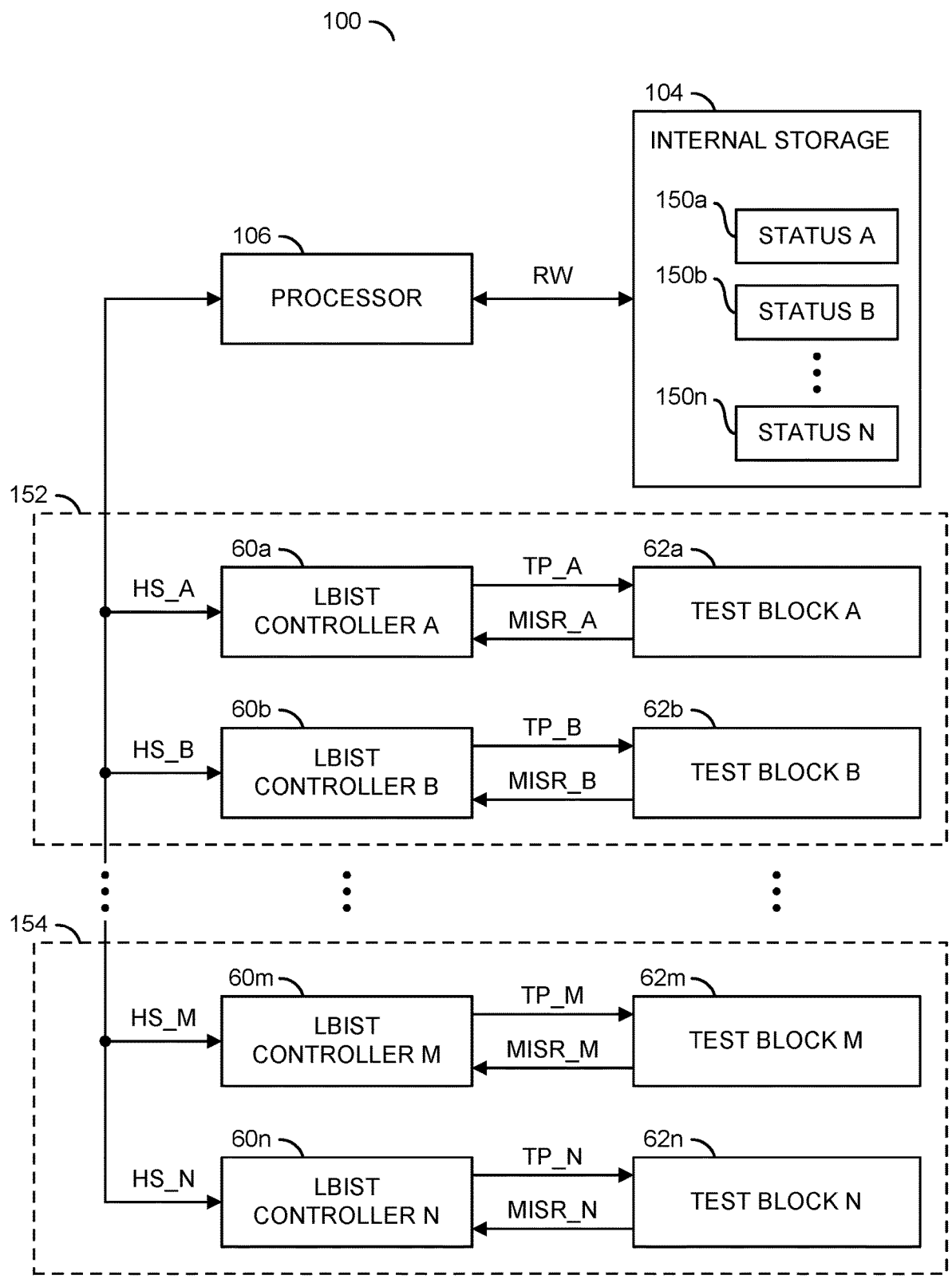
FIG. 3 is a block diagram illustrating storing status information for multiple LBIST controllers.

Referring to FIG. 3, a block diagram illustrating storing status information for multiple LBIST controllers is shown. An example embodiment of the apparatus 100 is shown. The example embodiment of the apparatus 100 may comprise the internal storage 104 and the processor 106. For illustrative purposes, the battery 102 and the power regulator 50 are not shown. The apparatus 100 may further comprise multiple LBIST controllers 60a-60n and multiple test blocks 62a-62n. Each of the LBIST controllers 60a-60n may have a functionality similar to the LBIST controller 60 described in association with FIG. 2. Each of the test blocks 62a-62n may have a functionality similar to the test block 62 described in association with FIG. 2.

The processor 106 may be configured to communicate the signals HS_A-HS_N with a respective one of the LBIST controllers 60a-60n. The signals HS_A-HS_N may comprise the handshake mechanism similar to the signal HS as described in association with FIG. 2. In an example, the computer readable instructions 110 may be configured to split the LBIST operations into the shutdown portion of the LBIST operations and the bootup portion of the LBIST operations for each of the LBIST controllers 60a-60n.

The processor 106 may implement a general purpose processor. The computer readable instructions 110 may enable the processor 106 to independently control the handshake mechanism for each of the LBIST controllers 60a-60n. The processor 106 may split each of the LBIST controllers 60a-60n between the shutdown portion of the status check and the bootup portion of the status check. For example, each of the LBIST controllers 60a-60n may perform a full set of LBIST operations either at startup or at shutdown. Each of the LBIST controllers 60a-60n may perform a full unit operation of the LBIST operations on the corresponding test blocks 62a-62n. The apparatus 100 may implement multiple of the LBIST controllers 60a-60n and the processor 106 may be configured to mix and match when each of the LBIST controllers 60a-60n perform the LBIST operations.

Each of the LBIST controllers 60a-60n may communicate a respective one of the test pattern signals TP_A-TP_N to a respective one of the test blocks 62a-62n. Each of the test blocks 62a-62n (e.g., generated by the logic gates 64) may be configured to generate a respective one of the output signals MISR_A-MISR_N to a respective one of the LBIST controllers 60a-60n. Each of the signals TP_A-TP_N may have a similar implementation as the test signal TP described in association with FIG. 2. Each of the signals MISR_A-MISR_N may have a similar implementation as the output signal MISR described in association with FIG. 2.

Each of the LBIST controllers 60a-60n are shown implementing the LBIST operations for a respective one of the test blocks 62a-62n. While one of the test blocks 62a-62n may be associated with one of the LBIST controllers 60a-60n, each of the test blocks 62a-62n may implement multiple circuits. For example, there may be more circuits in the test blocks 62a-62n than LBIST controllers. The number of circuits within the test blocks 62a-62n that the LBIST controllers 60a-60n determine the status information for and/or the number of LBIST controllers 60a-60n that the processor 106 manages the handshake mechanism for may be varied according to the design criteria of a particular implementation.

The internal storage 104 is shown comprising blocks (or circuits) 150a-150n. The circuits 150a-150n may comprise status information storage. The internal storage 104 may comprise other components (not shown). The number, type and/or arrangement of the components of the internal storage 104 may be varied according to the design criteria of a particular implementation.

The status information storage 150a-150n may be configured to store the status check results for the LBIST operations. Details of the arrangement of the status information storage 150a-150n may be described in association with FIG. 4. The status information storage 150a-150n may comprise a group of registers configured to store various bits of data to enable the processor 106 to store the results of the shutdown portion of the LBIST operations while the apparatus 100 is powered off.

The internal storage 104 may be configured to store the status check information for each of the LBIST controllers 60a-60n. For example, during shutdown, the status check information from the signal HS_A corresponding to the LBIST controller 60a may be written to the status information storage 150a, the status check information from the signal HS B corresponding to the LBIST controller 60b may be written to the status information storage 150b, the status check information from the signal HS_C corresponding to the LBIST controller 60c may be written to the status information storage 150c, etc. Similarly, during bootup, the processor 106 may retrieve the status check information stored in the status information storage 150a to communicate to the LBIST controller 60a via the signal HS_A, retrieve the status check information stored in the status information storage 150b to communicate to the LBIST controller 60b via the signal HS B, retrieve the status check information stored in the status information storage 150c to communicate to the LBIST controller 60c via the signal HS_C, etc. The internal storage 104 may comprise a sufficient amount of the status information storage 150a-150n for at least the number of the LBIST controllers 60a-60n implemented in the apparatus 100. The number of the status information storage 150a-150n implemented as groups of registers in the internal memory 104 may be varied according to the design criteria of a particular implementation.

A dotted box 152 and a dotted box 154 are shown. The dotted box 152 may represent the LBIST controllers 60a-60n selected by the processor 106 to perform the LBIST operations during startup (e.g., the startup portion of the LBIST operations). The dotted box 154 may represent the LBIST controllers 60a-60n selected by the processor 106 to perform the LBIST operations during shutdown (e.g., the shutdown portion of the LBIST operations). In the example shown, the LBIST controller 60a and the LBIST controller 60b may be a part of the startup portion of the LBIST operations 152 and the LBIST controller 60m and the LBIST controller 60n may be a part of the shutdown portion of the LBIST operations 154. Generally, each of the LBIST controllers 60a-60n may be selected to be a part of either the startup portion of the LBIST operations 152 or the shutdown portion of the LBIST operations 154 managed by the processor 106. The status check performed by the processor 106 may comprise the completion of all of the LBIST operations performed by each of the LBIST controllers 60a-60n that are part of the startup portion of the LBIST operations 152 and the LBIST controllers 60a-60n that are part of the shutdown portion of the LBIST controllers 154.

The processor 106 may be configured to select any of the LBIST controllers 60a-60n to perform the LBIST operations as one of the startup portion of the LBIST operations 152 or the shutdown portion of the LBIST operations 154. Each of the LBIST controllers 60a-60n may perform the LBIST operations for the corresponding test blocks 62a-62n either at shutdown or at startup. The processor 106 may divide the LBIST controllers 60a-60n and the associated test blocks 62a-62n into the startup portion of the LBIST operations 152 or the shutdown portion of the LBIST controllers 154 based on various characteristics of the LBIST controllers 60a-60n and/or the test blocks 62a-62n. The various characteristics analyzed by the processor 106 may comprise a circuit size, clock domains, physical locations, etc. The number of circuits and/or the various characteristics of the LBIST controllers 60a-60n and/or the test blocks 62a-62n that may be considered by the processor 106 to divide the LBIST controllers 60a-60n into the startup portion of the LBIST operations 152 or the shutdown portion of the LBIST controllers 154 may be varied according to the design criteria of a particular implementation.

To ensure that the status check for the apparatus 100 is completed, the processor 106 may ensure that each of the LBIST controllers 60a-60n performs the LBIST operations during a drive cycle of the apparatus 100 (e.g., from the time the apparatus 100 is powered on to the time apparatus is powered off by the power regulator 50). The number of LBIST controllers 60a-60n that may be managed by the processor 106 may be determined by the number of the status information storage 150a-150n implemented in the internal storage 104. For example, the status information storage 150a-150n may be implemented for each of the LBIST controllers 60a-60n to ensure that the status information may be saved after power down. Generally, the status information storage 150a-150n may only need to be used for the LBIST controllers 60a-60n that are used for the shutdown portion of the LBIST operations 154. However, since the processor 106 may be configured to mix and match which of the LBIST controllers 60a-60n may be used for the startup portion of the LBIST operations 152 and the shutdown portion of the LBIST operations 154, the status information storage 150a-150n may be implemented to provide storage registers for each of the LBIST controllers 60a-60n. The apparatus 100 may be scalable to accommodate more of the LBIST controllers 60a-60n by providing more registers for the status information storage 150a-150n in the internal storage 104.

Figure 4:
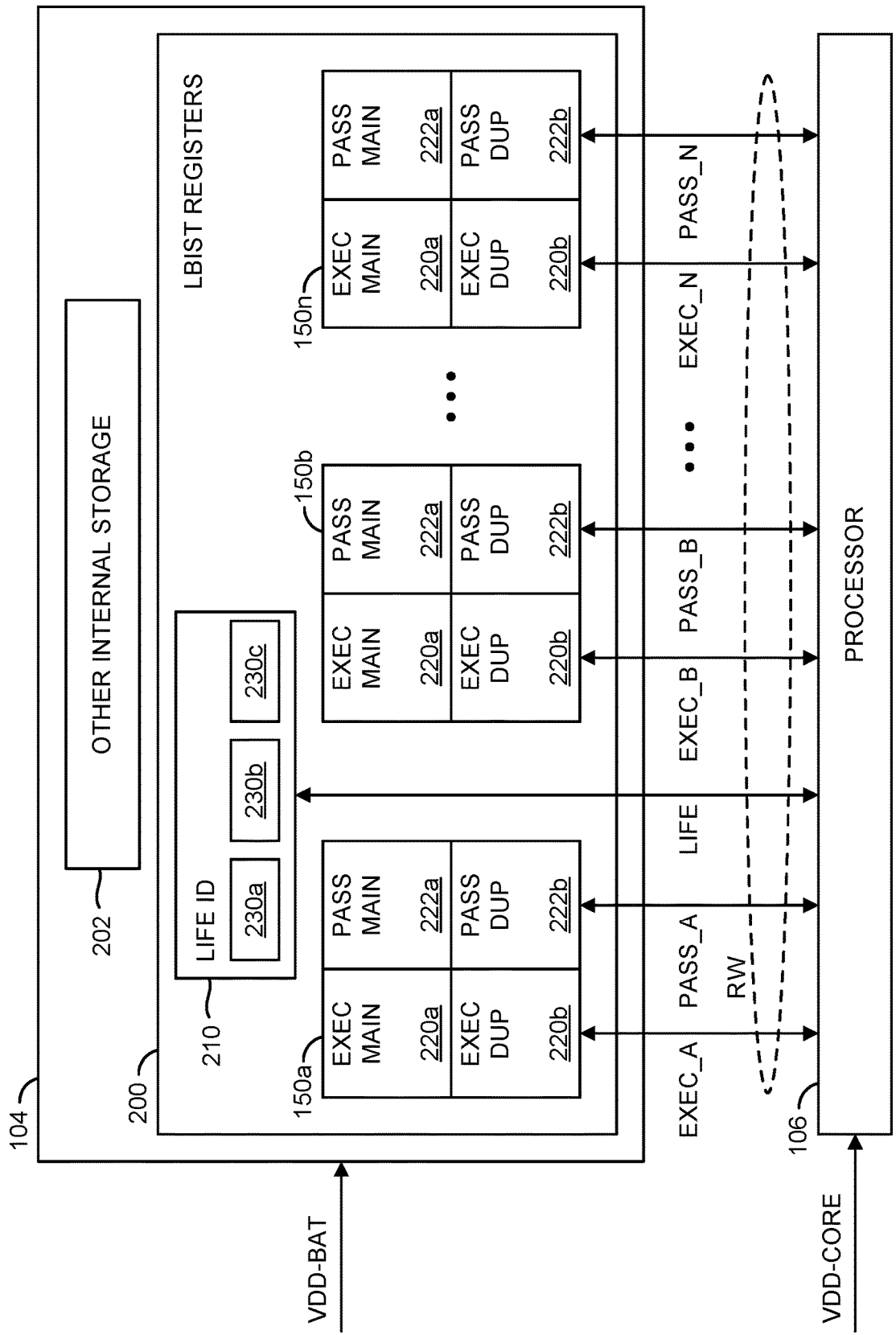
FIG. 4 is a block diagram illustrating registers for storing smart shutdown information.

Referring to FIG. 4, a block diagram illustrating registers for storing smart shutdown information is shown. The internal storage 104 and the processor 106 of the apparatus 100 are shown. The internal storage 104 may be powered by the signal VDD-BAT from the battery 102. The processor 106 may be powered by the signal VDD-CORE from the power regulator 50. The internal storage 104 and the processor 106 are shown communicating the signal RW.

The internal storage 104 may comprise a block (or circuit) 200 and/or a block (or circuit) 202. The circuit 200 may comprise LBIST registers. The circuit 202 may comprise other storage. The internal storage 104 may comprise other components (not shown). The number, type, arrangement and/or storage capacity of the components of the internal storage 104 may be varied according to the design criteria of a particular implementation.

The LBIST registers 200 may comprise dedicated storage for the status check operations (e.g., the LBIST operations). The LBIST registers 200 may be configured to enable the processor 106 to store and retrieve data that may ensure that the handshake mechanism between the shutdown portion of the LBIST operations 154 and the bootup portion of the LBIST operations 152 is functional. The other internal storage 202 may comprise registers that may be set aside for other data storage. For example, other functionality of the processor 106 and/or the apparatus 100 may utilize the other internal storage 202 for data storage that may be preserved even after the apparatus 100 is powered down.

The LBIST registers 200 may comprise the status information storage blocks 150a-150n and/or a block (or circuit) 210. The circuit 210 may comprise life ID storage. The LBIST registers 200 may comprise other components (not shown). The number, type, arrangement and/or capacity of the LBIST registers 200 may be varied according to the design criteria of a particular implementation.

Each of the status information storage blocks 150a-150n may comprise a number of registers. In embodiments of the apparatus implementing LBIST as the status check, the status information storage blocks 150a-150n may comprise at least four registers. The four registers of each of the information storage blocks 150a-150n may comprise an executed register pair 220a-220b and a passed register pair 222a-222b. The executed register 220a may store an executed main bit. The executed register 220b may store an executed duplicate bit. The passed register 222a may store a passed main bit. The passed register 222b may store a passed duplicate bit.

The executed register main bit 220a may be configured to store an indication that the shutdown portion of the LBIST operations for one of the LBIST controllers 60a-60n has been executed. In an example, a value of 1 (e.g., a logical high value) may indicate that the shutdown portion of the LBIST operations 154 has been executed and a value of 0 (e.g., a logical low value) may indicate that the shutdown portion of the LBIST operations 154 has not been executed.

The executed register duplicate bit 220b may be configured to store an inverse value of the executed register main bit 220a. For example, in response to the shutdown portion of the LBIST operations 154 being performed, a value of 0 (e.g., a logical low value) may be written to the executed register duplicate bit 220b. Similarly, in response to the shutdown portion of the LBIST operations 154 not being performed, a value of 1 (e.g., a logical high value) may be written to the executed register duplicate bit 220b.

The passed register main bit 222a may be configured to store an indication that the shutdown portion of the LBIST operations 154 for one of the LBIST controllers 60a-60n has provided a pass result. In an example, a value of 1 (e.g., a logical high value) may indicate that the shutdown portion of the LBIST operations 154 has generated a pass result and a value of 0 (e.g., a logical low value) may indicate that the shutdown portion of the LBIST operations 154 has generated a fail result.

The passed register duplicate bit 222b may be configured to store an inverse value of the passed register main bit 222a. For example, in response to the shutdown portion of the LBIST operations 154 generating a pass result, a value of 0 (e.g., a logical low value) may be written to the passed register duplicate bit 222b. Similarly, in response to the shutdown portion of the LBIST operations 154 generating a fail result, a value of 1 (e.g., a logical high value) may be written to the passed register duplicate bit 222b.

The executed register main bit 220a may be received by the processor 106 and used to determine whether a particular one of the LBIST controllers 60a-60n selected to perform the LBIST operations at shutdown has completely executed the LBIST operations (e.g., the shutdown portion of the LBIST operations 154). The passed register main bit 222a may be received by the processor 106 and used to determine whether a particular one of the LBIST controllers 60a-60n selected to perform the LBIST operations at shutdown has provided a pass result (e.g., in response to the shutdown portion of the LBIST operations 154).

In the event of a random hardware defect, data stored in the status information storage registers 150a-150n may be affected. For example, one of the bits stored in the executed register main bit 220a or the passed register main bit 222a may be randomly flipped due to a random hardware defect. In order to be compliant with automotive design guidelines that require protection from random hardware defects, the executed register duplicate bit 220b and the passed register duplicate bit 222b may be implemented. The executed register main bit 220*a* and the executed register duplicate bit 220*b* may store two versions of the executed bit and the passed register main bit 222*a* and the passed register duplicate bit 222*b* may store two versions of the passed bit to provide hardware redundancy. For example, the executed register main bit 220*a* and the passed register main bit 222*a* may store an original status bit, while the executed register duplicate bit 220*b* and the passed register duplicate bit 222*b* may store an inverse value of the original status bit. Storing the original status bit (executed and passed) and the inverse of the status bit may provide protection against a single hardware defect. For example, if the main status bit and duplicate status bit are the same value, the processor 106 may interpret the stored data as a random defect and the apparatus 100 may be placed in a safe state.

The executed register pair 220*a*-220*b* and the passed register pair 222*a*-222*b* may be implemented by each of the status information storage 150*a*-150*n*. For example, there may be the executed register pair 220*a*-220*b* and the passed register pair 222*a*-222*b* dedicated to each of the LBIST controllers 60*a*-60*n*. In an example, the executed register pair 220*a*-220*b* and the passed register pair 222*a*-222*b* for the status information storage 150*a* may store the executed main bit, the executed duplicate bit, the passed main bit and the passed duplicate bit for the LBIST controller 60*a*, the executed register pair 220*a*-220*b* and the passed register pair 222*a*-222*b* for the status information storage 150*b* may store the executed main bit, the executed duplicate bit, the passed main bit and the passed duplicate bit for the LBIST controller 60*b*, etc.

In one example, for the status information storage 150*a*, in response to reading a 1 value stored by the executed register main bit 220*a*, a 0 value stored by the executed register duplicate bit 220*b*, a 1 value stored by the passed register main bit 222*a* and a 0 value stored by the passed register duplicate bit 222*b*, the processor 106 may determine that shutdown portion of the LBIST operations 154 for the LBIST controller 60*a* have been executed and passed. In another example, for the status information storage 150*b*, in response to reading a 0 value stored by the executed register main bit 220*a*, a 1 value stored by the executed register duplicate bit 220*b*, a 0 value stored by the passed register main bit 222*a* and a 1 value stored by the passed register duplicate bit 222*b*, the processor 106 may determine that shutdown portion of the LBIST operations 154 for the LBIST controller 60*b* have not yet been performed (e.g., the passed status may be irrelevant until the LBIST operations have been fully executed). In yet another example, for the status information storage 150*c*, in response to reading a 1 value stored by the executed register main bit 220*a*, a 0 value stored by the executed register duplicate bit 220*b*, a 0 value stored by the passed register main bit 222*a* and a 1 value stored by the passed register duplicate bit 222*b*, the processor 106 may determine that shutdown portion of the LBIST operations 154 for the LBIST controller 60*c* have been performed and failed (e.g., a hardware defect has been detected). In still another example, for the status information storage 150*d*, in response to reading a 1 value stored by the executed register main bit 220*a*, a 0 value stored by the executed register duplicate bit 220*b*, a 1 value stored by the passed register main bit 222*a* and a 1 value stored by the passed register duplicate bit 222*b*, the processor 106 may determine that the passed register main bit 222*a* and the passed register duplicate bit 222*b* are the same value, which may indicate a hardware defect in the internal storage 104.

Each of the executed register pairs 220*a*-220*b* are shown communicating a respective signal (e.g., EXEC_A-EX-EC_N) with the processor 106. Each of the passed register pairs 222*a*-222*b* are shown communicating a respective signal (e.g., PASS_A-PASS_N). The signals EXEC_A-EXEC_N and the signals PASS_A-PASS_N may be components of the signal RW communicated between the internal storage 104 and the processor 106.

The signals EXEC_A-EXEC_N may be configured to communicate the values for the executed register main bit 220*a* and the executed register duplicate bit 220*b*. In an example, during the shutdown of the apparatus 100, the processor 106 may write the executed status for the LBIST controller 60*a* to the executed register main bit 220*a* of the status information storage 150*a* via the signal EXEC_A and the processor 106 may write the passed status for the LBIST controller 60*a* to the passed register main bit 222*a* of the status information storage 150*a* via the signal PASS_A. In another example, during the bootup of the apparatus 100, the processor 106 may read the executed status for the LBIST controller 60*a* from the executed register main bit 220*a* and the executed register duplicate bit 220*b* via the signal EXEC_A and the processor 106 may read the passed status for the LBIST controller 60*a* from the passed register main bit 222*a* and the passed register duplicate bit 222*b* via the signal PASS_A. The processor 106 may determine whether the status check has passed by analyzing the values for the signals EXEC_A-EXEC_N and/or the signals PASS_A-PASS_N and/or initiate the startup portion of the LBIST operations 152 by communicating the signals HS_A-HS_N with the respective LBIST controllers 60*a*-60*n* that have been selected to perform the LBIST operations during bootup.

In an example, the status check may be completed when the processor 106 receives the signals EXEC_A-EXEC_N and the signals PASS_A-PASS_N from the internal storage 104 that indicate the shutdown portion of the LBIST operations 154 have been executed successfully (e.g., all hardware passed on shutdown) and the processor 106 receives the signals HS_A-HS_N from the LBIST controllers 60*a*-60*n* that have been selected for the startup portion of the LBIST operations 152 that indicate the LBIST operations have been executed successfully (e.g., all hardware passed on startup). If one or more of the signals EXEC_A-EXEC_N indicate that some of the LBIST controllers 60*a*-60*n* did not complete the LBIST operations during shutdown, the processor 106 may generate one or more of the signals HS_A-HS_N to provide the start command to enable the LBIST operations for the LBIST controllers 60*a*-60*n* that did not complete the LBIST operations during shutdown to perform the LBIST operations as part of the startup portion of the LBIST operations 152. In an example, if the LBIST controller 60*a* had been selected to perform the LBIST operations as part of the shutdown portion of the LBIST operations 154, but did not complete the LBIST operations (e.g., the executed register main bit 220*a* stored a 0 value and the executed register duplicate bit 220*b* stored a 1 value), then the processor 106 may generate the signal HS_A at startup in order to enable the LBIST controller 60*a* to perform the LBIST operations as part of the startup portion of the LBIST operations 152. If any of the LBIST controllers 60*a*-60*n* detect a hardware defect (e.g., during either the startup portion of the LBIST operations 152 or the shutdown portion of the LBIST operations 154), the processor 106 may perform a reaction to the hardware defect. In some embodiments, if one of the LBIST controllers 60*a*-60*n* detected a hardware defect during shutdown (e.g., the passed register main bit 222*a* stored a 0 value and the passed register duplicate bit 222*b* stored a 1 value), the processor 106 may enable the LBIST controllers 60a-60n that failed during shutdown to perform the LBIST operations again as part of the startup portion of the LBIST operations 152 (e.g., the hardware defect may be corrected due to a power cycle).

The life ID storage 210 may comprise blocks (or circuits) 230a-230c. The blocks 230a-230c may comprise storage registers. The storage registers 230a-230c may implement life identity registers. The life identity registers 230a-230c may be configured to provide storage for indicating a first-time power on for the apparatus 100. The life ID storage 210 may be configured to communicate a signal (e.g., LIFE). The signal LIFE may be communicated between the life ID storage 210 and the processor 106. The signal LIFE may be a component of the signal RW communicated between the internal storage 104 and the processor 106. The signal LIFE may communicate the values of the life identity registers 230a-230c. In an example, the processor 106 may write the values for each of the life identity registers 230a-230c via the signal LIFE. In another example, the processor 106 may read the values for the each of the life identity registers 230a-230c via the signal LIFE. The arrangement of the registers, the data and/or the signals of the life ID storage 210 may be varied according to the design criteria of a particular implementation.

Generally, the first time the apparatus 100 is powered on, each of the executed register pairs 220a-220b and each of the passed register pairs 222a-222b may all be the same value (e.g., all storing zero values since no data has been written yet). Generally, if the processor 106 were to read zero values from the executed register main bit 220a and the executed register duplicate bit 220b (or the passed register main bit 222a and the passed register duplicate bit 222b), the processor 106 may detect a random hardware defect in the internal storage 104 (e.g., the duplicate bit value matches the main bit value). The life identity registers 230a-230c may be configured to provide the processor 106 additional context to prevent detecting a hardware defect on the first time power on of the apparatus 100.

The life identity registers 230a-230c may store a 000 value the first time the apparatus 100 is powered on and/or after all power from the battery 102 has been disconnected (e.g., no data has yet been written). The processor 106 may read the signal LIFE to determine if a 000 is detected in the life identity registers 230a-230c. The processor 106 may skip (e.g., not check) the status information for the shutdown portion of the LBIST operations 154. The processor 106 may write a predetermined pattern of bits (e.g., a 101 value) to the life identity registers 230a-230c during the shutdown portion of the LBIST operations 154.

In an example, when the life identity registers 230a-230c provide a 000 value in the signal LIFE, the processor 106 may determine that the apparatus 100 is in a first-time power on status (e.g., all of the LBIST controllers 60a-60n may be selected to perform the LBIST operations as part of the startup portion of the LBIST operations 152). In another example, when the life identity registers 230a-230c provide a 101 value in the signal LIFE, the processor 106 may determine that the status information storage 150a-150n may provide the status information about the LBIST operations (e.g., normal operation during the regular lifetime of the apparatus 100). In response to detecting other combinations for the life identity registers 230a-230c, the processor 106 may determine that there has been a hardware defect introduced during operation of the apparatus 100. While values of 000 and 101 are used as example values for the life identity registers 230a-230c, the various values and/or the interpretation of the values by the processor 106 may be varied according to the design criteria of a particular implementation.

Figure 5:
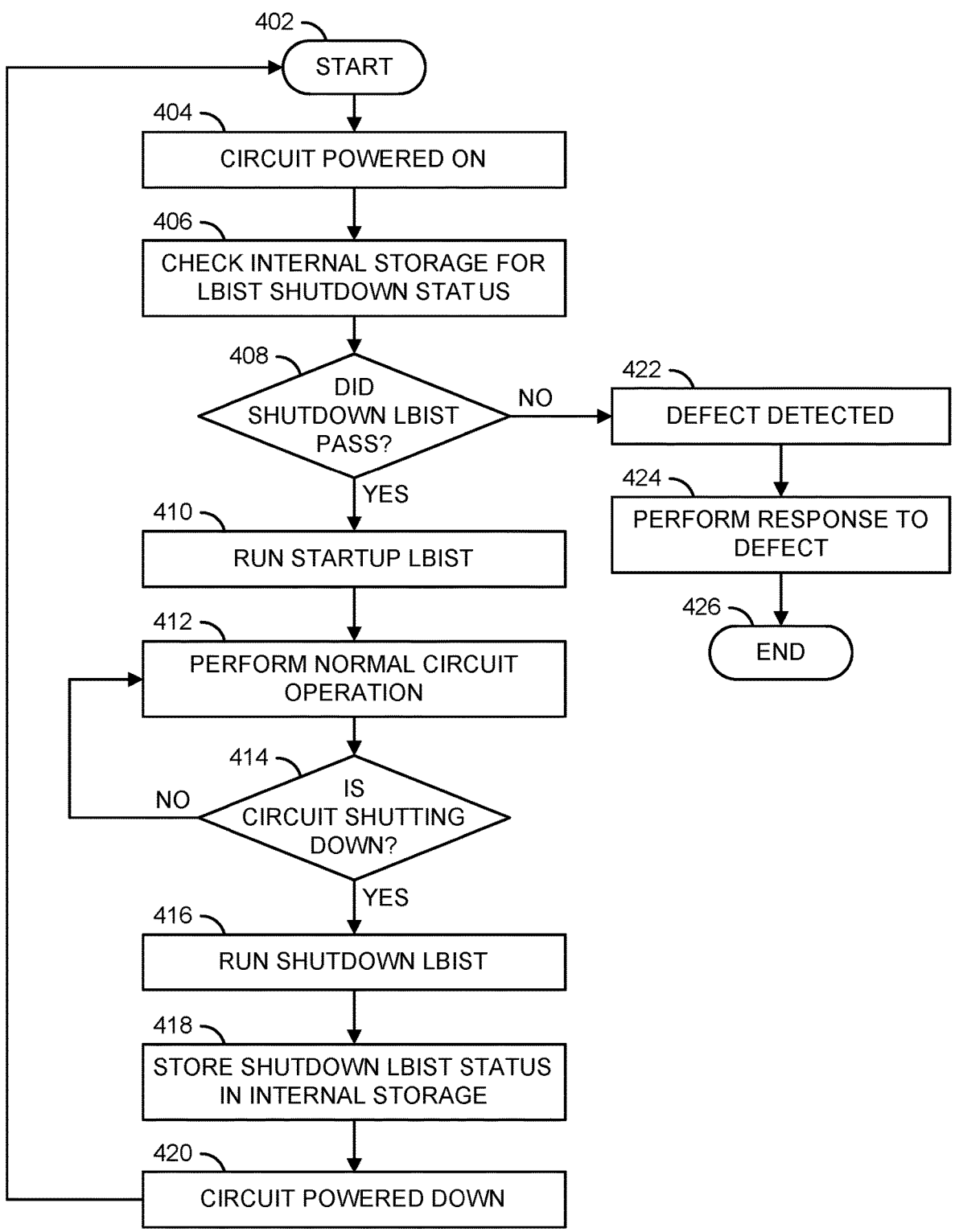
FIG. 5 is a flow diagram illustrating a method for implementing smart storage for LBIST shutdown.

Referring to FIG. 5, a method (or process) 400 is shown. The method 400 may implement smart storage for LBIST shutdown. The method 400 generally comprises a step (or state) 402, a step (or state) 404, a step (or state) 406, a decision step (or state) 408, a step (or state) 410, a step (or state) 412, a decision step (or state) 414, a step (or state) 416, a step (or state) 418, a step (or state) 420, a step (or state) 422, a step (or state) 424 and a step (or state) 426.

The step 402 may start the method 400. In the step 404, the apparatus 100 may be powered on. For example, the power regulator 50 may receive an external power supply and present the pre-determined voltage level signal VDD-CORE to the circuit 52 (e.g., the LBIST controllers 60a-60n, the test blocks 62a-62n, the processor 106 and/or other components). In the step 406, the processor 106 may check the internal storage 104 for the status information storage 150a-150n to determine the shutdown status of the shutdown portion of the LBIST operations 154. In an example, the internal storage 104 may retain the status information because the battery 102 may provide the pre-determined and persistent voltage signal VDD-BAT even when the apparatus 100 is powered off. Next, the method 400 may move to the decision step 408.

In the decision step 408, the processor 106 may determine whether the shutdown portion of the LBIST operations 154 passed for each of the LBIST controllers 60a-60n selected by the processor 106 to perform the status check during shutdown. For example, the processor 106 may receive the signal RW from the internal storage 104 to read the status information storage 150a-150n for each of the LBIST controllers 60a-60n selected to perform the status check during shutdown. If the shutdown portion of the LBIST operations 154 indicate a pass, then the method 400 may move to the step 410. In the step 410, processor 106 may enable the LBIST controllers 60a-60n that have been selected to perform the status check during startup to run the bootup portion of the LBIST operations 152. Next, in the step 412, the apparatus 100 may perform normal operations. For example, if the apparatus 100 is configured to generate and/or encode the all-around view 34a-34d and/or perform computer vision operations on the all-around view 34a-34d (as shown in association with FIG. 1), the functionality may be performed after the bootup portion of the LBIST operations 152 have been performed by the LBIST controllers 60a-60n that have been selected by the processor 106 to perform the status check during startup. Next, the method 400 may move to the decision step 414.

In the decision step 414, the processor 106 may determine whether the apparatus 100 is shutting down. In an example, the processor 106 may receive the shutdown signal SD. If the processor 106 is not shutting down, the method 400 may return to the step 412 and continue performing normal circuit operations. If the processor 106 is shutting down, then the method 400 may move to the step 416.

In the step 416, the processor 106 may initiate the shutdown portion of the LBIST operations 154. For example, the LBIST controllers 60a-60n that have been selected to perform the status check during shutdown may perform the shutdown portion of the LBIST operations 154 on the respective test circuits 62a-62n to detect hardware defects in the logic gates 64. Next, in the step 418, the processor 106 may receive the status information about the shutdown portion of the LBIST operations 154 from the LBIST controllers 60a-60n and store the status information in the internal storage 104. In an example, the processor 106 may write the status information for the shutdown portion of the LBIST operations 154 in the internal storage 104 via the signal RW. In the step 420, the apparatus 100 may be powered down. For example, the external power supply may be removed and the power regulator 50 may no longer present the pre-determined voltage level signal VDD-CORE to the circuit 52 (e.g., the LBIST controllers 60a-60n, the test blocks 62a-62n, the processor 106 and/or other components) The internal storage 104 may provide storage for the status information even after the apparatus 100 is powered off because the battery 102 may provide the persistent voltage signal VDD-BAT. Next, the method 400 may return to the 402.

In the decision step 408, if the shutdown portion of the LBIST operations 154 does not indicate a pass, then the method 400 may move to the step 422. In the step 422, the processor 106 may determine that a hardware defect has been detected in the logic gates 64 of one or more of the test circuits 62a-62n. Next, in the step 424 the processor 106 may perform a response to the defect. In one example, the processor 106 may disable one of the test circuits 62a-62n. In another example, the processor 106 may log an error code for the defect and shutdown the apparatus 100. In yet another example, the processor 106 may indicate that the data from the test circuits 62a-62n may be unreliable. The type of response performed may be varied according to the design criteria of a particular implementation. Next, the method 400 may move to the step 426. The step 426 may end the method 400.

Figure 6:
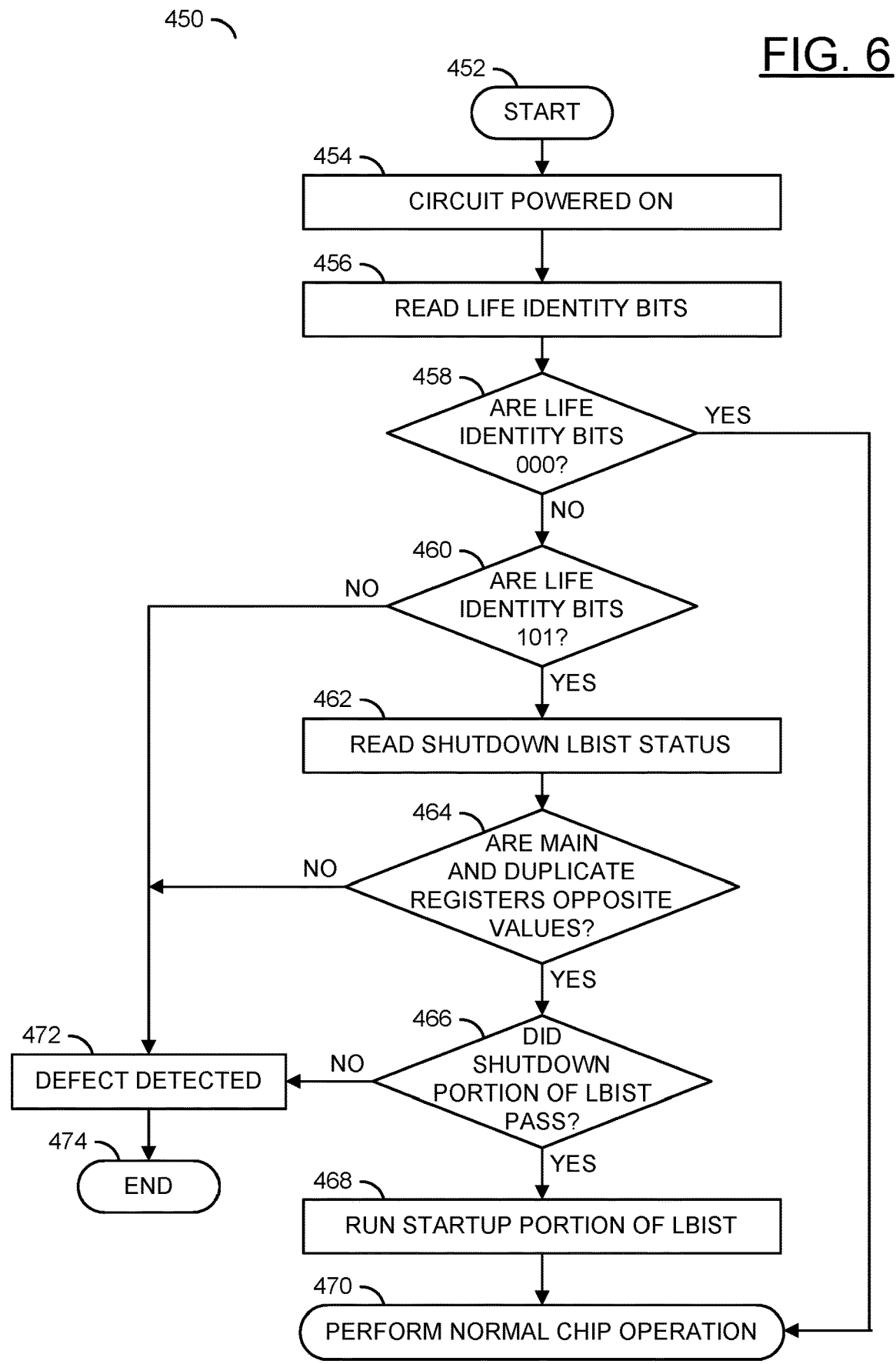
FIG. 6 is a flow diagram illustrating a method for implementing a bootup portion of a smart self-test system.

Referring to FIG. 6, a method (or process) 450 is shown. The method 450 may implement a bootup portion of a smart self-test system. The method 450 generally comprises a step (or state) 452, a step (or state) 454, a step (or state) 456, a decision step (or state) 458, a decision step (or state) 460, a step (or state) 462, a decision step (or state) 464, a decision step (or state) 466, a step (or state) 468, a step (or state) 470, a step (or state) 472, and a step (or state) 474.

The step 452 may start the method 450. In the step 454, the apparatus 100 may be powered on. Next, in the step 456, the processor 106 may read the life identity registers 230a-230c. For example, the life ID storage 210 may communicate the signal LIFE to the processor 106. Next, the method 450 may move to the decision step 458.

In the decision step 458, the processor 106 may determine whether the life identity registers 230a-230c store a 000 value. For example, a value of 000 may indicate a first-time power on of the apparatus 100 and/or that the battery 102 had been disconnected. If the life identity registers 230a-230c do have a 000 value, then the method 400 may move to the step 470. If the life identity registers 230a-230c do not have a value of 000, then the method 450 may move to the decision step 460.

In the decision step 460, the processor 106 may determine whether the life identity registers 230a-230c store a 101 value. For example, a value of 101 may indicate that the apparatus 100 is operating without a defect. If the life identity registers 230a-230c do not have a 101 value, then the method 450 may move to the step 472. If the life identity registers 230a-230c do have a 101 value, then the method 450 may move to the step 462. In the step 462, the processor 106 may read the shutdown LBIST status. For example, the processor 106 may receive the signals EXEC_A-EXEC_N and the signals PASS_A-PASS_N from the status information storage 150a-150n. Next, the method 450 may move to the decision step 464.

In the decision step 464, the processor 106 may determine whether the main and duplicate registers have the opposite values. For example, the processor 106 may compare the executed register main bit 220a and the executed register duplicate bit 220b with each other and compare the passed register main bit 222a and the passed register duplicate bit 222b with each other. If the main and duplicate registers are not opposite values, then the method 450 may move to the step 472. For example, the main and duplicate registers storing the same value may indicate a hardware defect in the internal storage 104. If the main and duplicate registers are opposite values, then the method 450 may move to the decision step 466.

In the decision step 466, the processor 106 may determine whether the shutdown portion of the LBIST operations 154 have passed. In an example, the processor 106 may check the executed register main bit 220a for a value of 1 to determine whether the shutdown portion of the LBIST operations have been performed, and if the shutdown operations of the LBIST operations 154 have been performed, then the passed register main bit 222a may be checked for a value of 1. If the executed register main bit 220a and the passed register main bit 222a have a 1 value, then the method 450 may move to the step 468. In the step 468, the processor 106 may enable the other LBIST controllers 60a-60n (e.g., the LBIST controllers selected to perform the status check at startup) to perform the startup portion of the LBIST operations 152. In an example, in response to the signals EXEC_A-EXEC_N having a 1 value for the executed register main bit 220a and the signals PASS_A-PASS_N having a 1 value for the passed register main bit 222a, the processor 106 may generate the signals HS_A-HS_N to provide the LBIST controllers 60a-60n with the LBIST start command for the bootup portion of the LBIST operations 152. Next, the method 450 may move to the step 470. For example, in response to the bootup portion of the LBIST operations 152 being performed successfully, the processor 106 may determine that all LBIST operations have passed. In the step 470, the apparatus 100 may perform normal chip operations. Performing normal operations may end the method 450.

In the decision step 466, if the executed register main bit 220a and/or the passed register main bit 222a do not have a 1 value, then the method 450 may move to the step 472. In the step 472, the processor 106 may detect a defect. The type of detect detected and/or the response to the defect detected by the processor 106 may be determined based on the hardware that has the defect detected and/or the type of defect detected. Next, the method 450 may move to the step 474. The step 474 may end the method 450.

Figure 7:
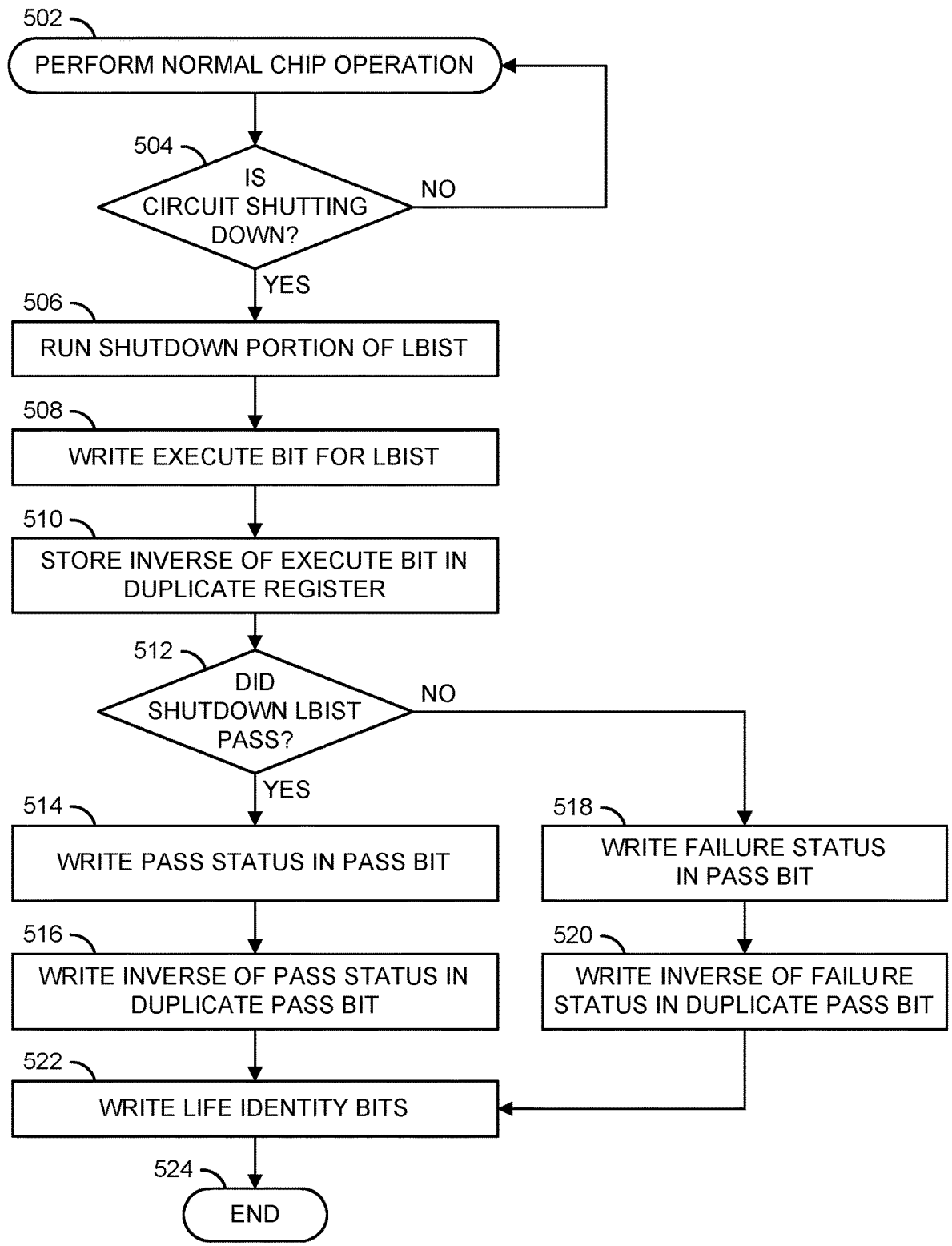
FIG. 7 is a flow diagram illustrating a method for implementing a shutdown portion of a smart self-test system.

Referring to FIG. 7, a method (or process) 500 is shown. The method 500 may implement a shutdown portion of a smart self-test system. The method 500 generally comprises a step (or state) 502, a decision step (or state) 504, a step (or state) 506, a step (or state) 508, a step (or state) 510, a decision step (or state) 512, a step (or state) 514, a step (or state) 516, a step (or state) 518, a step (or state) 520, a step (or state) 522, and a step (or state) 524.

The step 502 may start the method 500. In the step 502, the apparatus 100 may perform normal chip operations. Next, in the decision step 504, the processor 106 may determine whether the apparatus 100 is shutting down. If the apparatus 100 is not shutting down, then the method 500 may return to the step 502 and perform normal chip operations. If the apparatus 100 is shutting down, then the method 500 may move to the step 506.

In the step 506, the processor 106 may enable the LBIST controllers 60a-60n to run the shutdown portion of the LBIST operations. For example, the processor 106 may communicate the signal HS_A-HS_N to provide the LBIST start command for the LBIST controllers that have been selected by the processor 106 to perform the shutdown portion of the LBIST operations 154. Next, in the step 508, the processor 106 may write the executed bit to the internal storage 104. In an example, the processor 106 may communicate the signals EXEC_A-EXEC_N to the status information storage 150a-150n and the value of 1 may be written to the executed register main bits 220a. In the step 510, the internal storage 104 may store the inverse of the execute bit in the executed register duplicate bits 220b. For example, the processor 106 may write the value of 0 to the executed register duplicate bits 220b. Next, the method 500 may move to the decision step 512.

In the decision step 512, the processor 106 may determine whether the shutdown portion of the LBIST operations 154 have passed. In an example, after the LBIST controllers 60a-60n selected to perform the shutdown portion of the LBIST operations 154 on the respective test circuits 62a-62n, the LBIST controllers 60a-60n may communicate the signal HS_A-HS_N with the status information. If the shutdown portion of the LBIST operations 154 have passed, then the method 500 may move to the step 514. In the step 514, the processor 106 may write the passed status to the corresponding status information storage 150a-150n of the internal storage 104. In an example, for the LBIST controllers 60a-60n that have passed the shutdown portion of the LBIST operations 154, the processor 106 may communicate the signals PASS_A-PASS_N comprising a 1 value for storage in the passed register main bits 222a. Next, in the step 516, the internal storage 104 may store an inverse of the pass status in the status information storage 150a-150n. In an example, for the LBIST controllers 60a-60n that have passed the shutdown portion of the LBIST operations 154, the processor 106 may communicate the signals PASS_A-PASS_N comprising a 0 value for storage in the passed register duplicate bits 222b. Next, the method 500 may move to the step 522.

In the decision step 512, if the shutdown portion of the LBIST operations 154 have failed, then the method 500 may move to the step 518. In the step 518, the processor 106 may write the failure status to the corresponding status information storage 150a-150n of the internal storage 104. In an example, for the LBIST controllers 60a-60n that have failed the shutdown portion of the LBIST operations 154, the processor 106 may communicate the signals PASS_A-PASS_N comprising a 0 value for storage in the passed register main bits 222a. Next, in the step 520, the internal storage 104 may store an inverse of the failure status in the status information storage 150a-150n. In an example, for the LBIST controllers 60a-60n that have failed the shutdown portion of the LBIST operations 154, the processor 106 may communicate the signals PASS_A-PASS_N comprising a 1 value for storage in the passed register duplicate bits 222b. Next, the method 500 may move to the step 522.

In the step 522, the processor 106 may write the life identity bits. For example, the processor 106 may communicate the signal LIFE to the life identity block 210 to write a 101 value to the life identity registers 230a-230c (e.g., to indicate that the apparatus 100 is operating normally). Next, the method 500 may move to the step 524. The step 524 may end the method 500.

Figure 8:
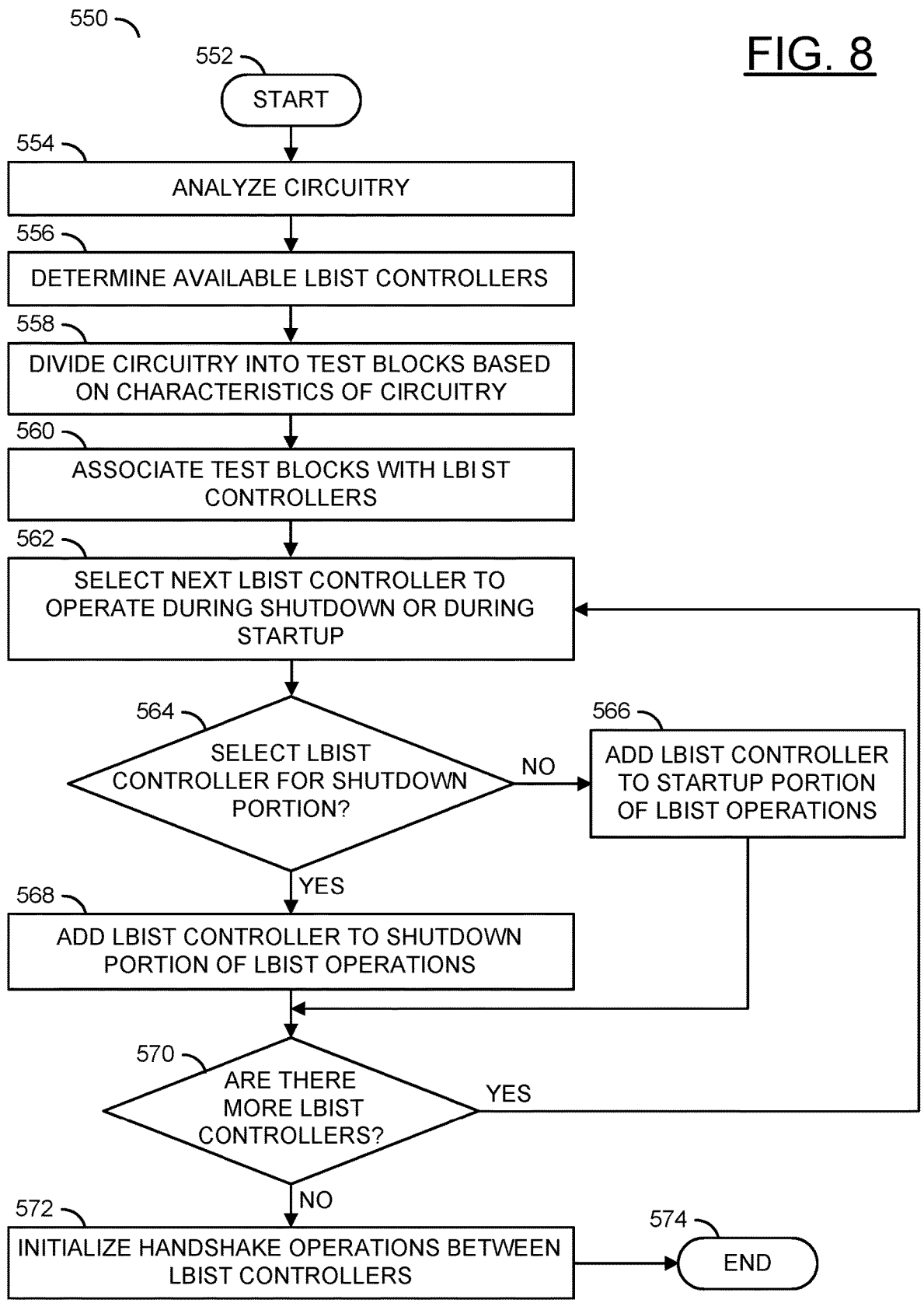
FIG. 8 is a flow diagram illustrating a method for selecting circuitry for performing status checks during shutdown and startup.

Referring to FIG. 8, a method (or process) 550 is shown. The method 550 may select circuitry for performing status checks during shutdown and startup. The method 550 generally comprises a step (or state) 552, a step (or state) 554, a step (or state) 556, a step (or state) 558, a step (or state) 560, a step (or state) 562, a decision step (or state) 564, a step (or state) 566, a step (or state) 568, a decision step (or state) 570, a step (or state) 572, and a step (or state) 574.

The step 552 may start the method 550. In the step 554, the processor 106 may analyze the circuitry of the apparatus 100. Next, in the step 556, the processor 106 may determine the available LBIST controllers 60a-60n implemented in the apparatus 100. In the step 558, the processor 106 may divide the circuitry of the apparatus 100 into the test blocks 62a-62n based on the characteristics of the circuitry (e.g., size, clock domain, physical location, etc.). Next, in the step 660, the processor 106 may associate each of the test blocks 62a-62n with one of the LBIST controllers 60a-60n. In the step 562, the processor 106 may select a next one of the LBIST controllers 60a-60n to determine whether to operate during the shutdown or startup of the apparatus 100. In an example, the processor 106 may determine how each of the LBIST controllers 60a-60n should be divided between the startup portion of the LBIST operations 152 and the shutdown portion of the LBIST operations 154. For example, the LBIST controllers 60a-60n may be divided according to an amount of time savings that may be achieved by performing the LBIST operations during shutdown instead of during bootup. In the example shown, the steps 562-570 may describe a sequence of operations for illustrative purposes (e.g., the LBIST controllers 60a-60n are categorized sequentially). However, one or more of the steps 562-570 may be performed in parallel or substantially in parallel. Next, the method 550 may move to the decision step 564.

In the decision step 564, the processor 106 may determine whether one of the LBIST controllers 60a-60n may be selected to perform the LBIST operations during the shutdown of the apparatus 100. If the one of the LBIST controllers 60a-60n may not be selected for performing the LBIST operations during the shutdown of the apparatus 100, then the method 550 may move to the step 566. In the step 566, the processor 106 may add the one of the LBIST controllers 60a-60n to the startup portion of the LBIST operations 152 (e.g., the selected one of the LBIST controllers 60a-60n may not perform the status check during shutdown). The LBIST controllers 60a-60n added to the startup portion of the LBIST operations 152 may be one subset of the LBIST controllers 60a-60n. Next, the method 550 may move to the decision step 570.

In the decision step 564, if the one of the LBIST controllers 60a-60n is selected for performing the LBIST operations during the shutdown of the apparatus 100, then the method 550 may move to the step 568. In the step 568, the processor 106 may add the one of the LBIST controllers 60a-60n to the shutdown portion of the LBIST operations 154 (e.g., the selected one of the LBIST controllers 60a-60n may perform the status check during shutdown and store the status information in the internal storage 104). The LBIST controllers 60a-60n added to the shutdown portion of the LBIST operations 154 may be another subset of the LBIST controllers 60a-60n. Next, the method 550 may move to the decision step 570.

In the decision step 570, the processor 106 may determine whether there are more of the LBIST controllers 60a-60n to categorize between the startup portion of the LBIST operations 152 and the shutdown portion of the LBIST operations 154. If there are more of the LBIST controllers 60a-60n to categorize, then the method 550 may return to the step 562. If all of the LBIST controllers 60a-60n have been categorized, then the method 550 may move to the step 572. In the step 572, the processor 106 may initialize the handshake operations between the various LBIST controllers 60a-60n. For example, the processor 106 may allocate space in the internal storage 104 for the various LBIST controllers 60a-60n that may perform the shutdown portion of the LBIST operations 154. Next, the method 550 may move to the step 574. The step 574 may end the method 550.

The functions performed by the diagrams of FIGS. 1-8 may be implemented using one or more of a conventional general purpose processor, digital computer, microprocessor, microcontroller, RISC (reduced instruction set computer) processor, CISC (complex instruction set computer) processor, SIMD (single instruction multiple data) processor, signal processor, central processing unit (CPU), arithmetic logic unit (ALU), video digital signal processor (VDSP) and/or similar computational machines, programmed according to the teachings of the specification, as will be apparent to those skilled in the relevant art(s). Appropriate software, firmware, coding, routines, instructions, opcodes, microcode, and/or program modules may readily be prepared by skilled programmers based on the teachings of the disclosure, as will also be apparent to those skilled in the relevant art(s). The software is generally executed from a medium or several media by one or more of the processors of the machine implementation.

The invention may also be implemented by the preparation of ASICs (application specific integrated circuits), Platform ASICs, FPGAs (field programmable gate arrays), PLDs (programmable logic devices), CPLDs (complex programmable logic devices), sea-of-gates, RFICs (radio frequency integrated circuits), ASSPs (application specific standard products), one or more monolithic integrated circuits, one or more chips or die arranged as flip-chip modules and/or multi-chip modules or by interconnecting an appropriate network of conventional component circuits, as is described herein, modifications of which will be readily apparent to those skilled in the art(s).

The invention thus may also include a computer product which may be a storage medium or media and/or a transmission medium or media including instructions which may be used to program a machine to perform one or more processes or methods in accordance with the invention. Execution of instructions contained in the computer product by the machine, along with operations of surrounding circuitry, may transform input data into one or more files on the storage medium and/or one or more output signals representative of a physical object or substance, such as an audio and/or visual depiction. The storage medium may include, but is not limited to, any type of disk including floppy disk, hard drive, magnetic disk, optical disk, CD-ROM, DVD and magneto-optical disks and circuits such as ROMs (read-only memories), RAMS (random access memories), EPROMs (erasable programmable ROMs), EEPROMs (electrically erasable programmable ROMs), UVPROMs (ultra-violet erasable programmable ROMs), Flash memory, magnetic cards, optical cards, and/or any type of media suitable for storing electronic instructions.

The elements of the invention may form part or all of one or more devices, units, components, systems, machines and/or apparatuses. The devices may include, but are not limited to, servers, workstations, storage array controllers, storage systems, personal computers, laptop computers, notebook computers, palm computers, cloud servers, personal digital assistants, portable electronic devices, battery powered devices, set-top boxes, encoders, decoders, transcoders, compressors, decompressors, pre-processors, post-processors, transmitters, receivers, transceivers, cipher circuits, cellular telephones, digital cameras, positioning and/or navigation systems, medical equipment, heads-up displays, wireless devices, audio recording, audio storage and/or audio playback devices, video recording, video storage and/or video playback devices, game platforms, peripherals and/or multi-chip modules. Those skilled in the relevant art(s) would understand that the elements of the invention may be implemented in other types of devices to meet the criteria of a particular application.

The terms "may" and "generally" when used herein in conjunction with "is(are)" and verbs are meant to communicate the intention that the description is exemplary and believed to be broad enough to encompass both the specific examples presented in the disclosure as well as alternative examples that could be derived based on the disclosure. The terms "may" and "generally" as used herein should not be construed to necessarily imply the desirability or possibility of omitting a corresponding element.

The designations of various components, modules and/or circuits as "a"-"n", when used herein, disclose either a singular component, module and/or circuit or a plurality of such components, modules and/or circuits, with the "n" designation applied to mean any particular integer number. Different components, modules and/or circuits that each have instances (or occurrences) with designations of "a"-"n" may indicate that the different components, modules and/or circuits may have a matching number of instances or a different number of instances. The instance designated "a" may represent a first of a plurality of instances and the instance "n" may refer to a last of a plurality of instances, while not implying a particular number of instances.

While the invention has been particularly shown and described with reference to embodiments thereof, it will be understood by those skilled in the art that various changes in form and details may be made without departing from the scope of the invention.

The invention claimed is:

1. An apparatus comprising:
 a battery configured to provide a persistent power source; and
 a circuit comprising (i) a processor, (ii) self-test logic, (iii) internal storage and (iv) logic circuitry, wherein
 (a) said self-test logic is configured to perform a status check to determine an operating status of said logic circuitry,
 (b) said processor is configured to enable (i) a first portion of said status check to be performed during a shutdown of said apparatus and (ii) a second portion of said status check to be performed during a bootup of said apparatus,
 (c) said battery provides said persistent power source to said internal storage after said shutdown of said apparatus,
 (d) parameters generated during said first portion of said status check are stored in said internal storage, and
 (e) said parameters stored in said internal storage are used with said second portion of said status check to determine said operating status of said logic circuitry.

2. The apparatus according to claim 1, wherein performing said first portion of said status check during said shutdown of said apparatus is configured to reduce an amount of time for said bootup of said apparatus.

3. The apparatus according to claim 2, wherein (i) said bootup of said apparatus is not complete until said self-test logic completes said status check and (ii) said amount of time for said bootup is reduced by a shutdown check amount of time for performing said first portion of said status check.

4. The apparatus according to claim 1, wherein said self-test logic is configured to enable said logic circuitry to operate normally in response to said status check determining said operating status of said logic circuitry does not have a defect.

5. The apparatus according to claim 1, wherein (i) said self-test logic is configured to generate a defect signal in response to said status check detecting a defect in said operating status of said logic circuitry and (ii) said apparatus is configured to enter a safe state in response to said defect signal.

6. The apparatus according to claim 1, wherein said processor is configured to execute computer readable instructions, said computer readable instructions configured to (i) split said status check performed by said self-test logic between said first portion of said status check and said second portion of said status check and (ii) implement a hand-shake operation to use said parameters determined during said first portion of said status check and stored in said internal storage with said second portion of said status check.

7. The apparatus according to claim 1, wherein (i) said self-test logic and said logic circuitry are powered by a first power supply, (ii) said first power supply is inactive after said shutdown of said apparatus and (iii) said battery provides said persistent power source to said internal storage while said first power supply is inactive.

8. The apparatus according to claim 1, wherein said internal storage comprises a plurality of registers powered by said battery.

9. The apparatus according to claim 1, wherein said parameters comprise an executed bit that provides an indication that said first portion of said status check was performed and a passed bit that provides an indication that said first portion of said status check has not detected a defect in said logic circuitry.

10. The apparatus according to claim 9, wherein said parameters comprise a duplicated executed bit and a duplicated passed bit configured to prevent misinterpretation of said parameters due to a hardware defect.

11. The apparatus according to claim 10, wherein said duplicated executed bit is configured to store an inverted version of said executed bit and said duplicated passed bit is configured to store an inverted version of said passed bit.

12. The apparatus according to claim 1, wherein said status check of said operating status of said logic circuitry is configured to detect defects in logic gates implemented by said logic circuitry.

13. The apparatus according to claim 1, wherein said self-test logic is configured to implement a LogicBIST protocol.

14. The apparatus according to claim 1, wherein (i) said self-test logic comprises a plurality of self-test controllers and said logic circuitry comprises a plurality of logic circuits, (ii) each of said self-test controllers is configured to perform said status check for one or more of said plurality of logic circuits and (iii) said internal storage is configured to store said parameters generated during said first portion for each of said self-test controllers configured to perform said status check during said shutdown of said apparatus.

15. The apparatus according to claim 14, wherein said internal storage comprises registers to store said parameters for each of said plurality of self-test controllers.

16. The apparatus according to claim 14, wherein said processor is configured to select a first subset of said plurality of said self-test controllers to perform said status check during said shutdown of said apparatus and a second subset of said plurality of said self-test controllers to perform said status check during a power on of said apparatus.

17. The apparatus according to claim 16, wherein (i) said first subset of said plurality of said self-test controllers is configured to complete said status check during said shutdown of said apparatus and store said parameters in said internal storage, (ii) said second subset of said plurality of self-test controllers is configured to provide results of said status check during said power on of said apparatus and (iii) said processor is configured to determine an operating status of said apparatus in response to said parameters in said internal storage and said results of said status check during said power on of said apparatus.

18. The apparatus according to claim 1, wherein said parameters comprise a first plurality of bits configured to indicate said status check and a second plurality of bits configured to indicate whether to perform said status check after a power on of said apparatus.

19. The apparatus according to claim 18, wherein (i) said second plurality of bits comprises three bits, (ii) said three bits are all a zero value to indicate to said processor to skip said status check after said power on, (iii) a predetermined pattern of said three bits is written to said internal storage to indicate a normal operating status of said apparatus and (iv) other combinations of said three bits indicate a defect in operation of said apparatus.

* * * * *